United States Patent
Ponton et al.

(10) Patent No.: US 10,651,869 B1
(45) Date of Patent: May 12, 2020

(54) SIGNED-RFDAC ARCHITECTURES ENABLING WIDEBAND AND EFFICIENT 5G TRANSMITTERS

(71) Applicants: Intel IP Corporation, Santa Clara, CA (US); Intel Corporation, Santa Clara, CA (US)

(72) Inventors: Davide Ponton, Warmbad-Villach (AT); Michael Kalcher, Graz (AT); Alan Paussa, Villach (AT); Edwin Thaller, Faak am See (AT); Franz Kuttner, St. Ulrich (AT); Daniel Gruber, St. Andrae (AT)

(73) Assignees: Intel IP Corporation, Santa Clara, CA (US); Intel Corporation, Santa Clara, CA (US)

( * ) Notice: Subject to any disclaimer, the term of this patent is extended or adjusted under 35 U.S.C. 154(b) by 0 days.

(21) Appl. No.: 16/364,891

(22) Filed: Mar. 26, 2019

(51) Int. Cl.
  *H03M 1/48* (2006.01)
  *H03M 1/66* (2006.01)
  *H04B 1/403* (2015.01)
  *H04B 1/401* (2015.01)
  *H04B 1/04* (2006.01)

(52) U.S. Cl.
  CPC .......... *H03M 1/665* (2013.01); *H04B 1/0475* (2013.01); *H04B 1/401* (2013.01); *H04B 1/403* (2013.01)

(58) Field of Classification Search
  CPC ........ H03M 1/665; H03M 1/48; H03M 1/485; H03M 1/668; H04B 1/403; H04B 1/401; H04B 1/0475
  USPC ...................................................... 341/117
  See application file for complete search history.

(56) References Cited

U.S. PATENT DOCUMENTS

| | | | | |
|---|---|---|---|---|
| 8,767,868 B2* | 7/2014 | Friedrich | ............. | H04B 1/0475 |
| | | | | 375/296 |
| 8,867,665 B2* | 10/2014 | Dufrene | ................... | H03C 5/00 |
| | | | | 375/295 |
| 8,891,681 B2* | 11/2014 | Boos | ....................... | H04L 27/00 |
| | | | | 375/224 |

(Continued)

FOREIGN PATENT DOCUMENTS

EP       2204910 A1    12/2008

OTHER PUBLICATIONS

"16-Bit, 12 GSPS, RF DAC and Digital Upconverter." Analog Devices. AD9163. 126 pages.

(Continued)

*Primary Examiner* — Jean B Jenglaude
(74) *Attorney, Agent, or Firm* — Eschweiler & Potashnik, LLC

(57) ABSTRACT

A radio frequency digital-to-analog converter (RFDAC) circuit includes an RFDAC array circuit including an array of cells arranged into a plurality of segments. Each segment of the plurality of segments is configured to process input data signals. The RFDAC array circuit is configured to process an input data based on activating a set of segments of the plurality of segments, forming a set of active segments, and when the sign of the input data is changed, deactivate a partially active segment of the set of active segments and activate a sign change segment within the RFDAC array circuit. The sign change segment includes a segment within the plurality of segments of the RFDAC array circuit that is different from the set of active segments.

27 Claims, 28 Drawing Sheets

(56) References Cited

U.S. PATENT DOCUMENTS

| | | | |
|---|---|---|---|
| 8,934,574 B2* | 1/2015 | Friedrich | H04B 1/0475 |
| | | | 375/297 |
| 9,225,565 B2* | 12/2015 | Simon | H04L 27/00 |
| 9,379,883 B1 | 6/2016 | Kuttner et al. | |
| 9,419,657 B1* | 8/2016 | Li Puma | H04B 1/0475 |
| 9,444,666 B2* | 9/2016 | Simon | H04L 27/00 |
| 9,450,798 B2* | 9/2016 | Muhammad | H04L 27/2623 |
| 9,531,399 B1 | 12/2016 | Kuttner | |
| 9,571,120 B2 | 2/2017 | Kuttner et al. | |
| 9,647,678 B2 | 5/2017 | Passamani et al. | |
| 2006/0291589 A1 | 12/2006 | Eliezer et al. | |
| 2010/0265112 A1 | 10/2010 | Ek et al. | |
| 2014/0211870 A1* | 7/2014 | Dufrene | H03C 5/00 |
| | | | 375/259 |
| 2014/0247905 A1* | 9/2014 | Friedrich | H04B 1/0475 |
| | | | 375/297 |

OTHER PUBLICATIONS

Fague, Daniel E. "New RF DAC Broadens Software-Defined Radio Horizon." Analog Dialogue 50-07, Jul. 2016. https://www.analog.com/en/analog-dialogue/articles/new-rf-dac-broadens-sdr-horizon.html. 4 pages.

Baker, Bonnie. "Direct-RF DACs for high-speed communications." EDN Network. Dec. 19, 2018. https://www.edn.com/design/analog/4461390/Direct-RF-DACs-for-high-speed-communications. 4 pages.

Pearson, Chris. "High Speed, Digital to Analog Converters Basics." Texas Instruments. Application Report. SLAA523A—Mar. 2012—Revised Oct. 2012. 21 pages.

Fulde, M. et al. "Innovative RFDAC Concepts for Digital Multi-Mode Transmitter in Cellular Applications." 2013 IEEE. PRIME 2013, Villach, Austria, Plenary Papers. 1 page.

* cited by examiner

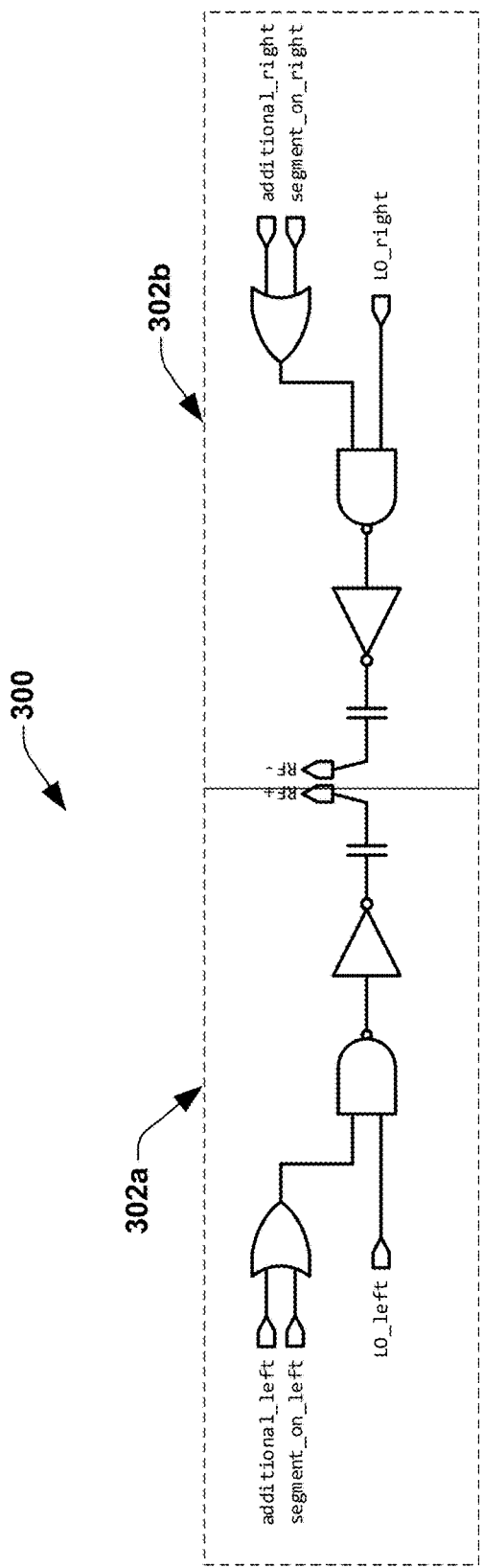
FIG. 3a
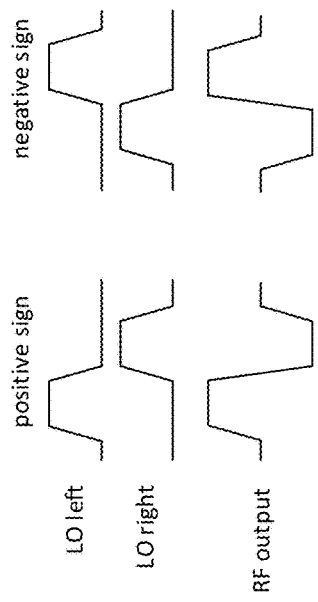
FIG. 3b  FIG. 3c

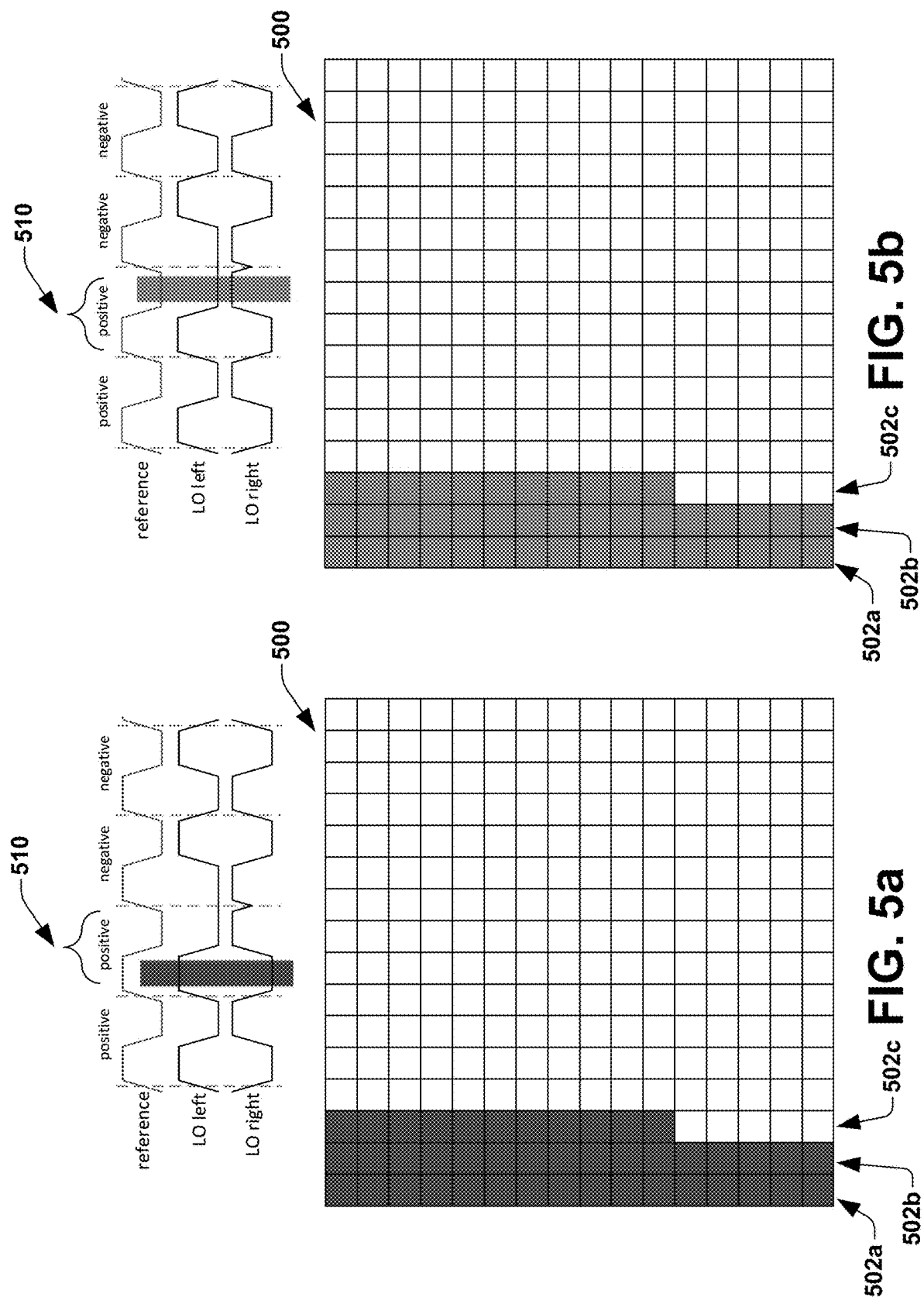

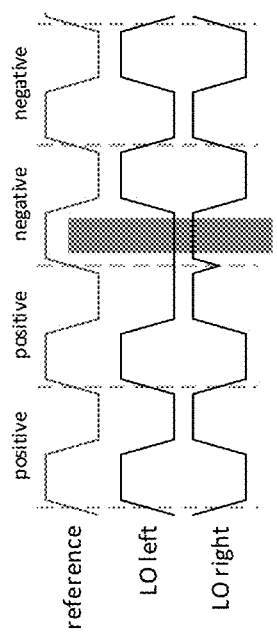
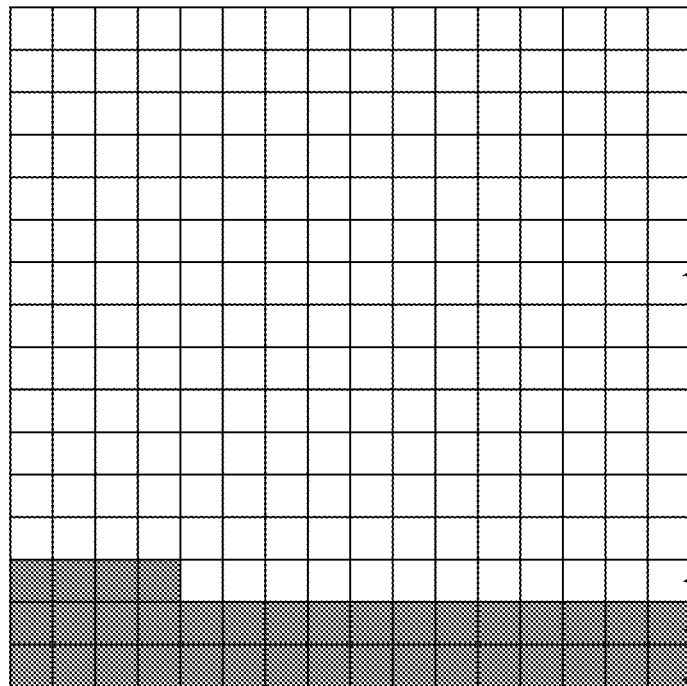
FIG. 5d
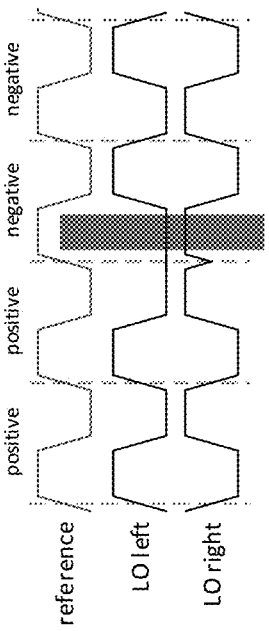
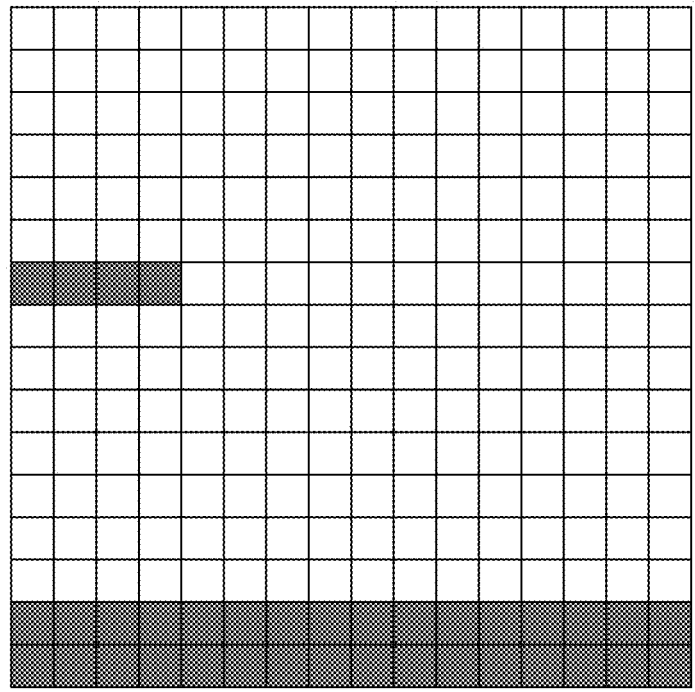
FIG. 5c

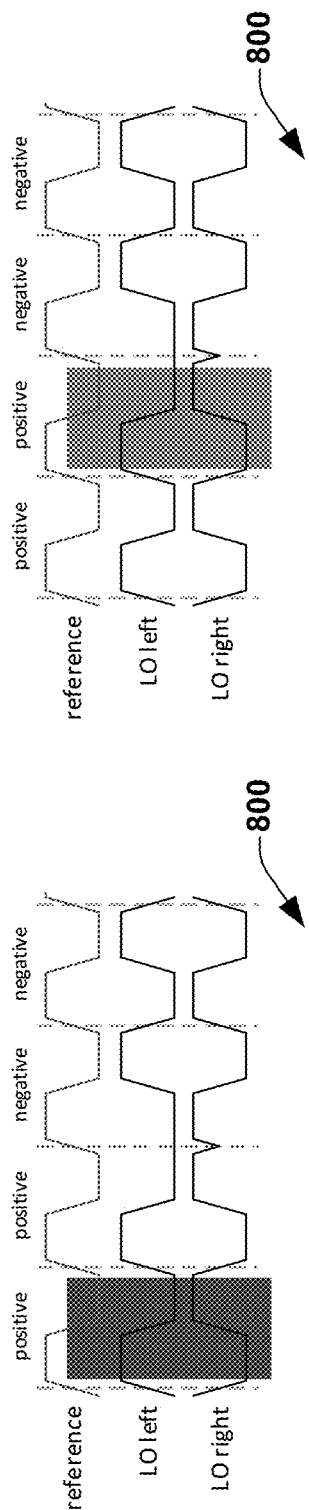
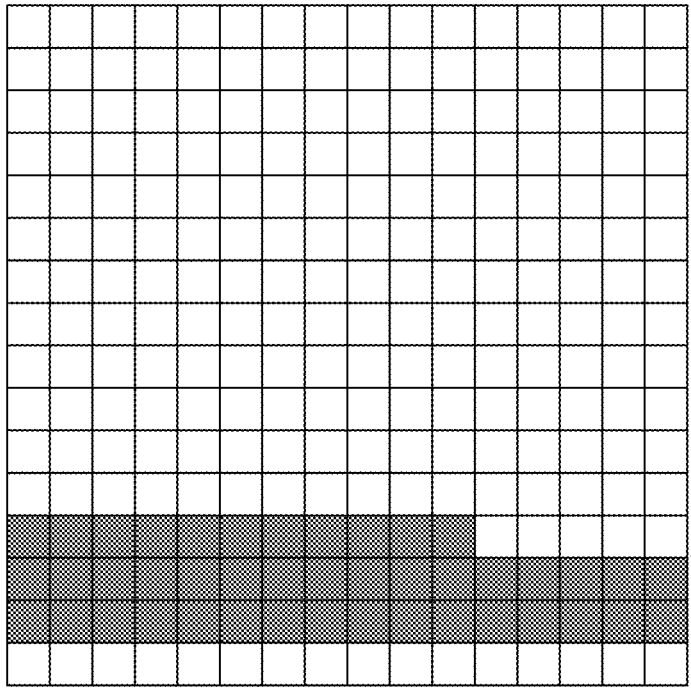
FIG. 8b
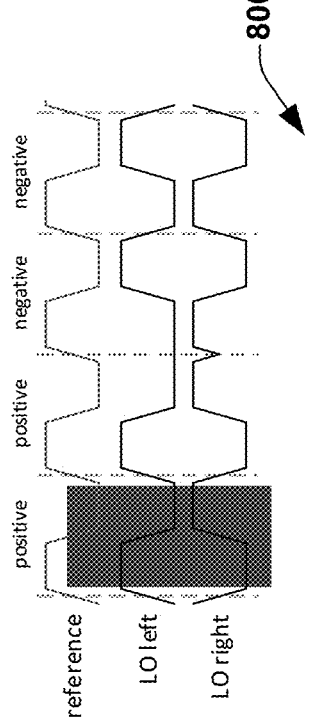
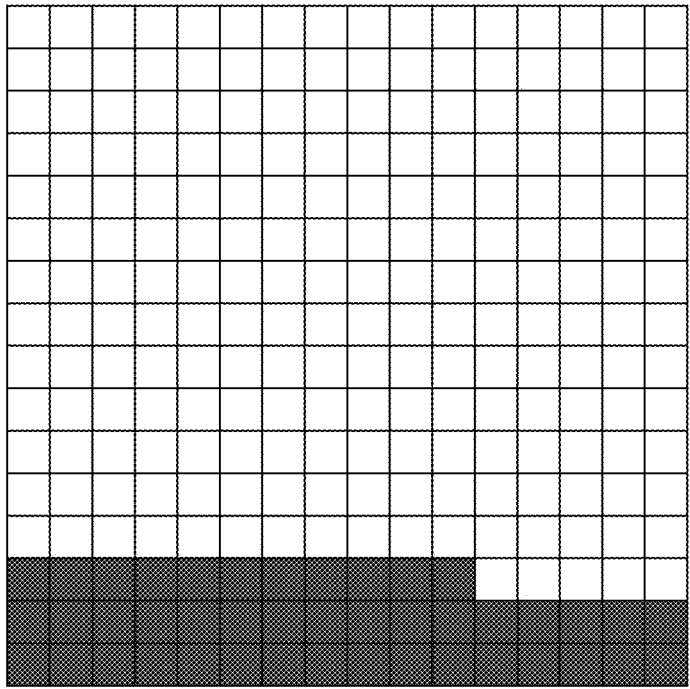
FIG. 8a

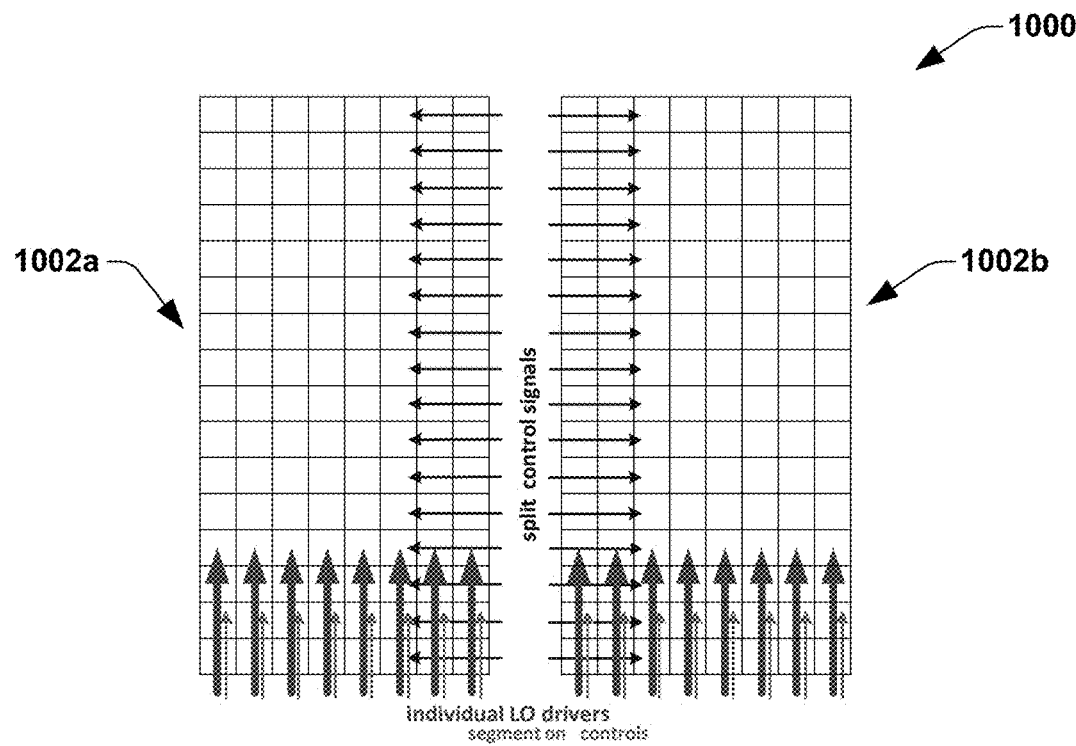
FIG. 10a
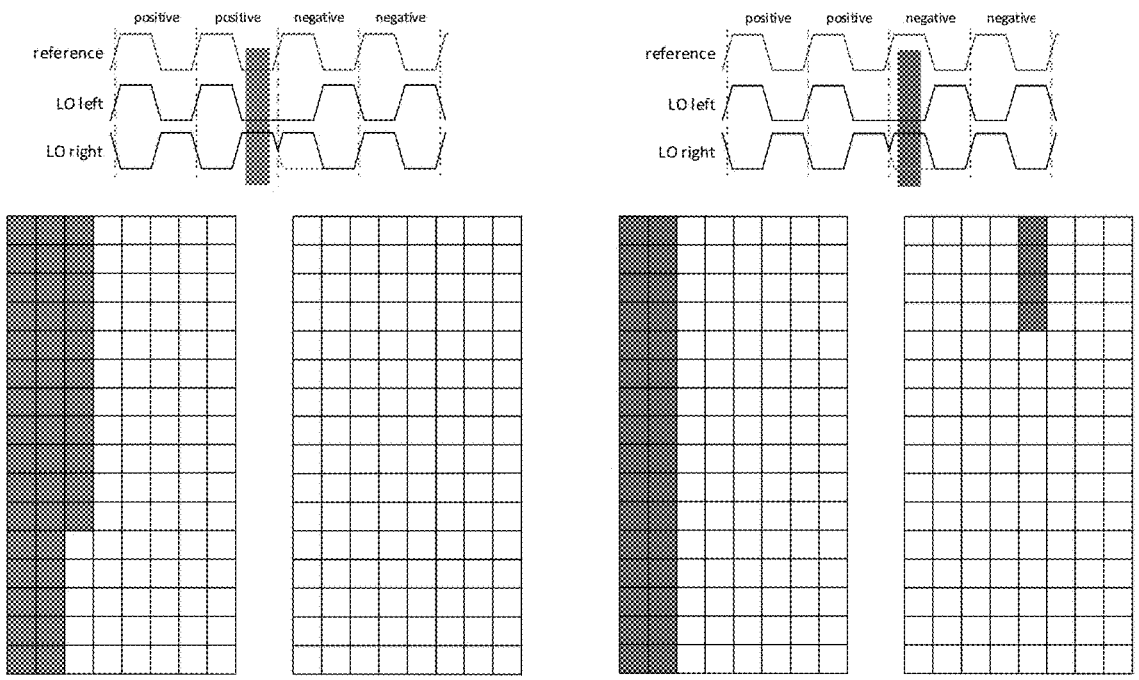
FIG. 10b  FIG. 10c

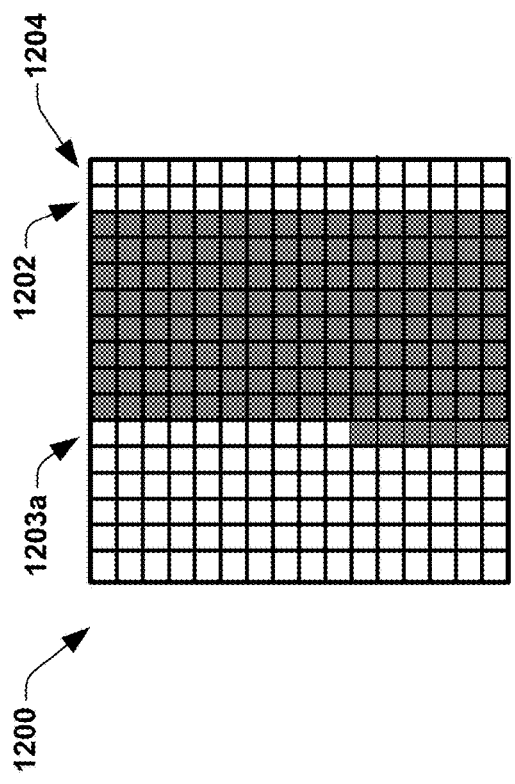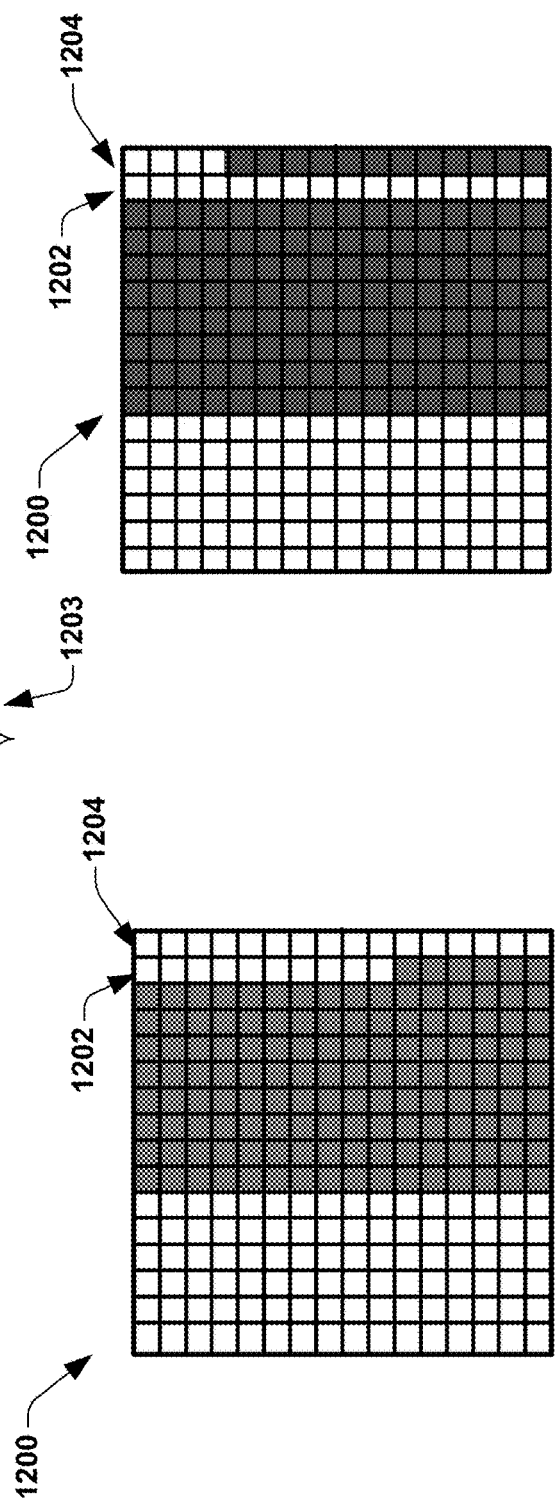

SIGNED-RFDAC ARCHITECTURES ENABLING WIDEBAND AND EFFICIENT 5G TRANSMITTERS

FIELD

The present disclosure relates to radio frequency digital to analog converters (RFDACs), and in particular, to systems and methods for supporting clean sign change in RFDACs.

BACKGROUND

With the proliferation of wireless networks, there is a need for more compact, low-cost, power efficient transmitters that are capable of supporting the various communication standards, including Bluetooth, WLAN, GSM/EDGE, WCDMA, 4G and 5G of 3GPP cellular. High speed data converters, for example, RFDACs are an integral part of radio frequency (RF) transmitters that support all the current multi-mode and multi-band communication standards. Recent technological advances have enabled clock rates on high speed data converters to move to higher and higher frequencies. To support the advanced RF transmitters, for example, 5G transmitters, efficiency and resolution of RFDACs have to be high.

BRIEF DESCRIPTION OF THE DRAWINGS

Some examples of circuits, apparatuses and/or methods will be described in the following by way of example only. In this context, reference will be made to the accompanying Figures.

FIG. 3a illustrates a simplified block diagram of an RFDAC cell within an RFDAC array circuit comprising two equal halves, driven with (local oscillator) LO signals that are phase shifted with respect to one another, according to one embodiment of the disclosure.

FIGS. 3b and 3c illustrates the temporal order of switching of a left half circuit and a right half circuit of an RFDAC cell for positive input data and negative input data, respectively, according to one embodiment of the disclosure.

FIGS. 5a-5d illustrates the activation of the RFDAC array cells associated with an RFDAC array circuit during the event of a sign change, showing the concept for clean sign-change, according to one embodiment of the disclosure.

FIGS. 8a-8d depicts one possible practical implementation of the sign switching procedure associated with I-phase or Q-phase input data in the RFDAC array circuit, according to one embodiment of the disclosure.

FIG. 10a illustrates a possible implementation of an RFDAC array circuit that supports the sign change control data signal, according to another embodiment of the disclosure.

FIG. 10b-10c show an example of cell activation during a sign change for the embodiment in FIG. 10a, according to one embodiment of the disclosure.

FIGS. 12a-12c illustrates the activation of the RFDAC array cells associated with an RFDAC array circuit during the event of a sign-change, according to one embodiment of the disclosure.

DETAILED DESCRIPTION

Figure 1:
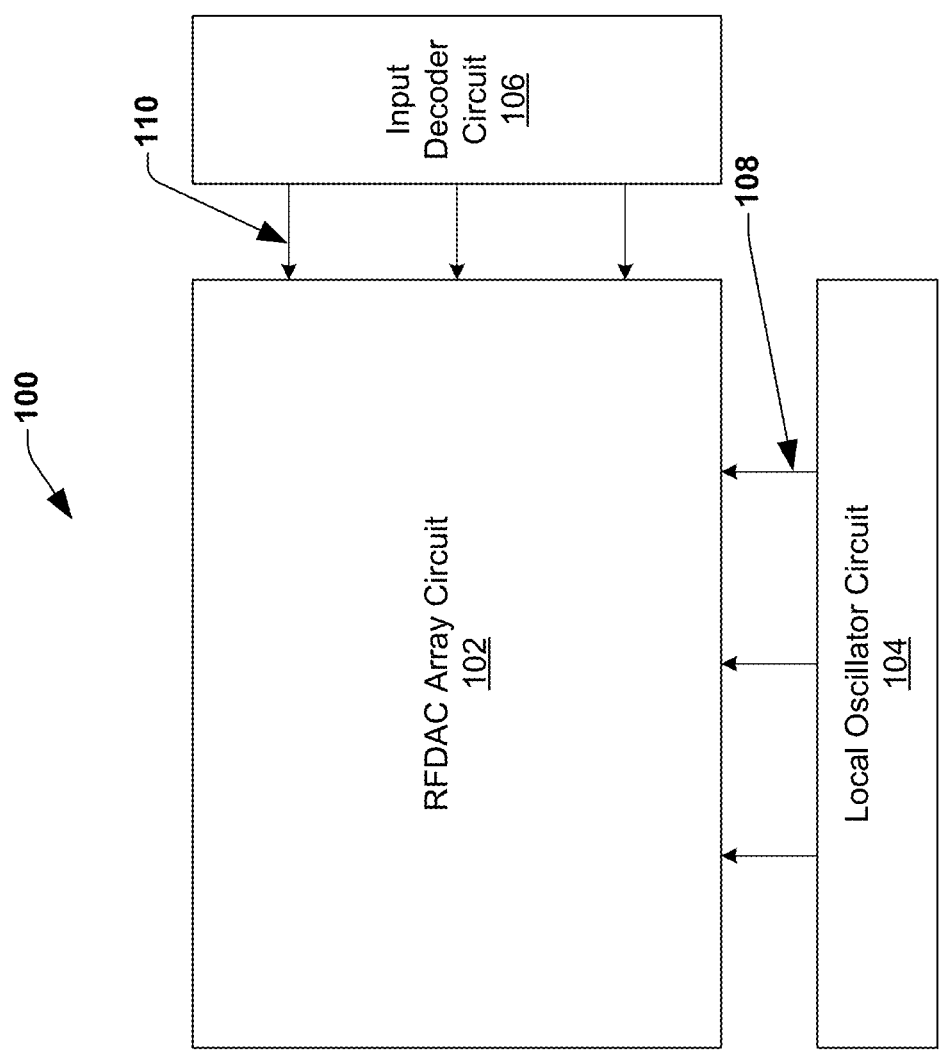
FIG. 1 illustrates a simplified block diagram of an exemplary radio frequency digital to analog converter (RFDAC) circuit, according to one embodiment of the disclosure.

In one embodiment of the disclosure, a radio frequency digital-to-analog converter (RFDAC) circuit is disclosed. The RFDAC circuit comprises an RFDAC array circuit comprising an array of cells arranged into a plurality of segments, each segment comprising a set of cells. In some embodiments, each segment of the plurality of segments is configured to process input data signals. In some embodiments, the RFDAC array circuit is configured to process an input data based on activating a set of segments of the plurality of segments, forming a set of active segments, in accordance with a local oscillator (LO) signal. In some embodiments, when a sign of the input data is changed, the RFDAC array circuit is further configured to deactivate a partially active segment of the set of active segments and activate a sign change segment within the RFDAC array circuit, in order to implement the sign change associated with the input data. In some embodiments, the sign change segment comprises a segment within the plurality of segments of the RFDAC array circuit that is different from the set of active segments.

In one embodiment of the disclosure, a radio frequency digital-to-analog converter (RFDAC) circuit is disclosed. The RFDAC circuit comprises an RFDAC array circuit comprising an array of cells arranged into a plurality of columns, each column comprising a set of cells. In some embodiments, one or more columns of the plurality of columns is configured to be selectively activated, in order to process an input data. In some embodiments, the one or more columns of the plurality of columns is configured to be activated, in accordance with a predefined first filling order, when the sign of the input data is positive. Further, in some embodiments, the one or more columns of the plurality of columns is configured to be activated, in accordance with a predefined second, different, filling order, when the sign of the input data is negative. In some embodiments, the filling order comprises an order in which the one or more columns of the plurality of columns are activated, in order to process the input data.

In one embodiment of the disclosure, a differential radio frequency digital-to-analog converter (RFDAC) circuit is disclosed. In some embodiments, the differential RFDAC circuit comprises a differential RFDAC array circuit comprising an array of differential cells, each differential cell comprising a first half cell circuit and a second half cell circuit. In some embodiments, the first half cell circuit and the second half cell circuit are driven by a local oscillator (LO) signal and an inverse LO signal respectively. In some embodiments, the differential RFDAC array circuit is configured to process an input data based on activating the first half cell circuit and the second half cell circuit associated with a group of differential cells of the array of differential cells, simultaneously in each LO period, during regular operation. In some embodiments, the differential RFDAC array circuit is further configured to activate a first set of half cell circuits comprising either a set of first half cell circuits or a set of second half cell circuits within the differential RFDAC array circuit, in an LO period preceding a sign change associated with the input data, in order to process the input data during a sign change. In some embodiments, the differential RFDAC array circuit is further configured to activate a second, different set of half cell circuits comprising either the set of first half cell circuits or the set of second half cell circuits that was not activated during the LO period preceding the sign change, in an LO period succeeding the sign change associated with the input data, in order to process the input data during the sign change.

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," "circuit" and the like are intended to refer to a computer-related entity, hardware, software (e.g., in execution), and/or firmware. For example, a component can be a processor (e.g., a microprocessor, a controller, or other processing device), a process running on a processor, a controller, an object, an executable, a program, a storage device, a computer, a tablet PC and/or a user equipment (e.g., mobile phone, etc.) with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific or certain functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the event that the terms "including", "includes", "having", "has", "with", or variants thereof are used in either the detailed description and the claims, such terms are intended to be inclusive in a manner similar to the term "comprising."

The following detailed description refers to the accompanying drawings. The same reference numbers may be used in different drawings to identify the same or similar elements. In the following description, for purposes of explanation and not limitation, specific details are set forth such as particular structures, architectures, interfaces, techniques, etc. in order to provide a thorough understanding of the various aspects of various embodiments. However, it will be apparent to those skilled in the art having the benefit of the present disclosure that the various aspects of the various embodiments may be practiced in other examples that depart from these specific details. In certain instances, descriptions of well-known devices, circuits, and methods are omitted so as not to obscure the description of the various embodiments with unnecessary detail.

As indicated above, in order to support the advanced RF transmitters, for example, 5G transmitters, efficiency and resolution of RFDACs have to be high. Further, the RFDAC needs to support signed operation. That is, the RFDAC should be capable to handle sign changes of input data. In RFDACs the digital-to-analog conversion is performed with a set of cells switched by a local oscillator (LO) signal. The number of cells contributing to the output signal is determined by the digital input code. Together with the LO signal, additional control signals (indicative of the input data) are needed in order to enable and disable the proper number of cells, based on the input code (i.e., the input data). In some embodiments, the input data may comprise signed data that may have positive values or negative values. Signed data can be represented in the RF domain by shifting the LO signal by 180°, practically inverting the LO signal for the LO periods when the sign of the data changes.

In case of a sign change, that is, a positive-to-negative sign transition or a negative-to-positive sign transition, enable and disable signals (i.e., the control signals indicative of the input data) need to be updated perfectly in sync with the LO signals, which, for implementations is hardly achievable if not impossible, as there is no additional time to update the amplitude data, i.e. to enable and disable the cells. In some embodiments, this results in data driven transitions, further details of which are given in embodiments below. In some embodiments, data driven transitions results either in glitches visible at the output or in errors, since the output amplitude is incorrect, eventually degrading performance of the RFDAC in EVM and especially out-of-band noise performance. This effect worsens with increased bandwidths, since the number of zero crossings raises and therefore also the number of errors introduced in the output signal. Therefore, this issue becomes more severe with upcoming communication standards, for example, in 5G transmitters. Therefore, achieving a clean sign change, that is, updating the control signals perfectly in sync with the LO signals is of paramount importance in RFDACs.

In existing implementations of RFDACs, the clean sign change is achieved by adding an auxiliary RFDAC (i.e., additional cells). In some embodiments, the auxiliary RFDAC allows to have a clean sign-change at the cost of efficiency, reducing maximum possible peak output power as well. In fact, these additional cells do not provide any signal and act as additional load, besides during the sign-change transition. Further, in some existing implementations, the clean sign change is achieved by reducing the LO duty cycle, e.g. to 25% or 33%. In some embodiments, reducing the LO duty cycle opens a window in time at the critical sign change where the data can be updated. However, reduction of the LO duty cycle from 50% results in lowered output power and therefore degradation in power efficiency. Additionally, the generation of such non-50% duty cycles is not straightforward and potentially increases circuit complexity and power consumption.

In order to overcome the above disadvantages, a plurality of methods to implement clean sign change in RFDACs is proposed in this disclosure. In particular, in one embodiment, a system and a method for RFDACs that enables clean sign change based on dynamically re-using any available DAC cell to support clean sign-change for the cells which change state (turn either ON or OFF) during a sign-change e.g., a partially active segment, further details of which are given in embodiments below. In another embodiment, a system and a method for RFDACs that enables clean sign change based on utilizing 2 additional columns, one positive and one negative, to support clean sign-change for the cells which change state (turn either ON or OFF) during a sign-change e.g., a partially active segment, further details of which are given in embodiments below. Further, in another embodiment, a system and a method for RFDACs that enables clean sign change based on utilizing a different filling order for positive input data and negative input data for columns of cells within an RFDAC array, further details of which are given in embodiments below. In yet another embodiment, a system and a method for differential RFDACs that enables clean sign change based on activating only a set of half cells associated with the differential RFDAC, driven by either one of an LO signal or an inverse LO signal, in an LO period preceding a sign change and in the LO period following the sign change, further details of which are given in embodiments below.

FIG. 1 illustrates a simplified block diagram of a radio frequency digital to analog converter (RFDAC) circuit 100, according to one embodiment of the disclosure. In some embodiments, the RFDAC circuit 100 may be included within RF transmitters of wireless communication systems. In some embodiments, the RFDAC circuit 100 facilitates clean sign change associated with signed input data. The RFDAC circuit 100 comprises an RFDAC array circuit 102, a local oscillator (LO) circuit 104 and an input decoder circuit 106. In some embodiments, the RFDAC array circuit 102 comprises an array of cells configured to process input data, that is, to perform digital to analog conversion of input data. In some embodiments, the RFDAC array circuit 102 is configured to process the input data based on an LO signal 108. In some embodiments, the LO signal 108 comprises one or more LO signals. In some embodiments, the LO circuit 104 is configured to provide the LO signal 108. In some embodiments, the LO circuit 108 may be further configured to generate/synthesize the LO signal 108, prior to providing the LO signal to the RFDAC array circuit 102. In some embodiments, the LO circuit 104 may comprise one or more LO circuits configured to provide one or more LO signals, respectively. In some embodiments, the input decoder circuit 106 is configured to decode the input data and generate control signals 110 to be provided to the RFDAC circuit, in order to activate/enable a required number of cells needed to process the input data. In some embodiments, the LO circuit 106 and the input decoder circuit 106 may be implemented as a single circuit. In some embodiments, the LO circuit 104 and the input decoder circuit 106 are coupled to one another, and is configured to perform a digital mixing of the input data with the LO signal, prior to providing the LO signals 108 and the control signals 110. In some embodiments, each individual RFDAC cell within the RFDAC array circuit may comprise two equal halves, called left half circuit 302a and right half circuit 302b, driven with opposite phases of the LO to generate the differential RF+ and RF− outputs, as shown in FIG. 3a. In such embodiments, the LO circuit 104 may be configured to provide an LO left signal and an LO right signal to drive the left half circuit 302a and the right half circuit 302b, respectively. In some embodiments, the LO left signal and the LO right signal are not strictly differential. In some embodiments, they are shifted in time by half of the LO period i.e., 180 degrees. Further, in some embodiments, each RFDAC cell comprises a differential cell comprising a first half cell circuit and a second half cell circuit driven by a local oscillator (LO) signal and an inverse LO signal, respectively. In such embodiments, the LO circuit 104 may be configured to provide the LO signal and the inverse LO signal. Alternately, in other embodiments, a single ended implementation (having single ended output) of each RFDAC cell is also contemplated to be within the scope of this disclosure.

Figure 2:
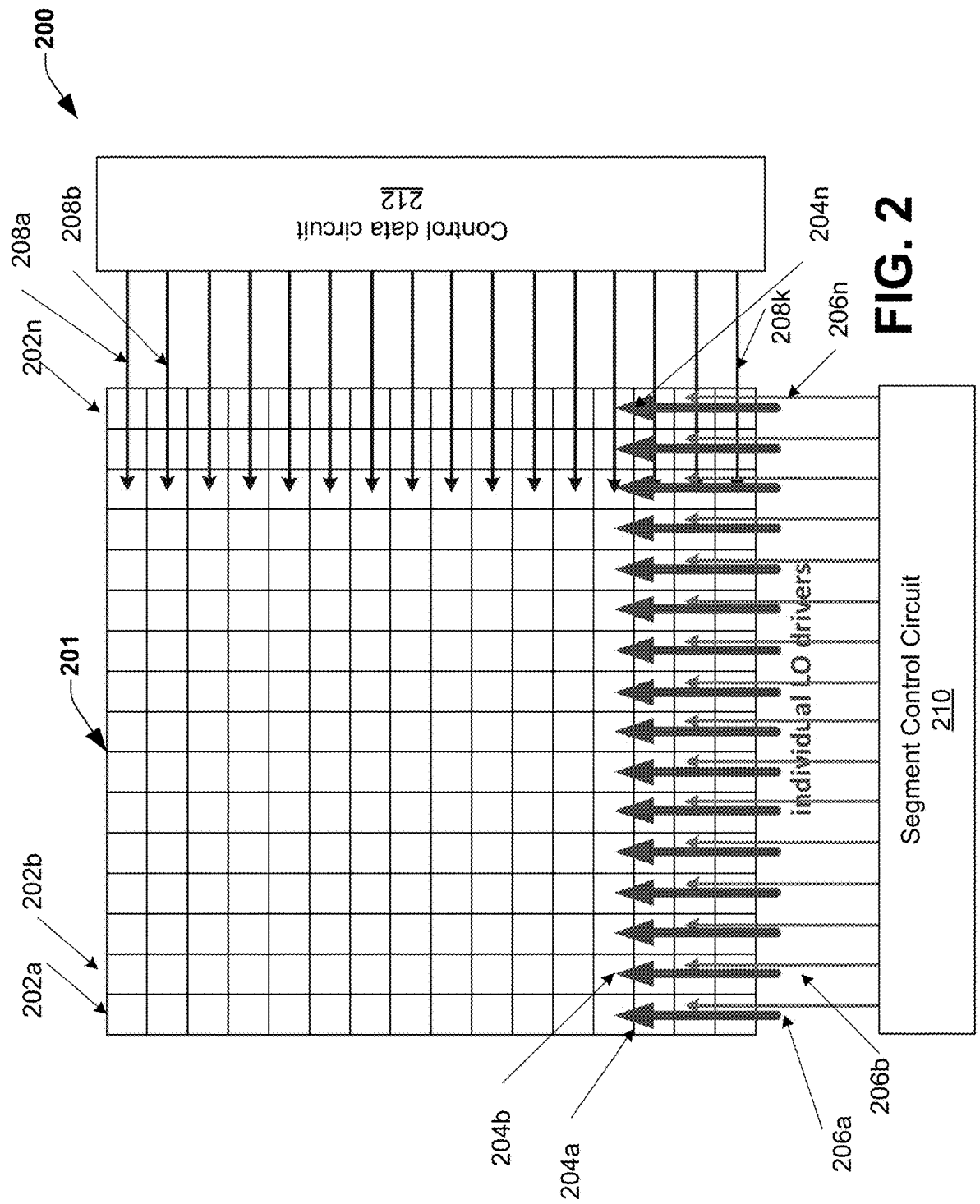
FIG. 2 illustrates a simplified block diagram of an RFDAC circuit, according to one embodiment of the disclosure.

In some embodiments, the RFDAC circuit 100 is configured to support signed operation. In other words, the RFDAC circuit 100 may be configured to process positive input data and negative input data. As indicated above, signed data can be represented in the RF domain by shifting the LO signal by 180°, practically inverting it for the LO periods where the sign of the input data changes. In such embodiments, the LO circuit 104 is configured to invert the LO signal, when the sign of the input data changes. Further, with the sign change, the control signals are updated to reflect the sign change (i.e., to enable/disable cells). In some embodiments, the control signals need to be updated perfectly in sync with the LO signals, in order to update the amplitude data, i.e., to enable and disable cells. In some embodiments, if the control signals and the LO signals are not in sync, data driven transitions may occur, further details of which are given in embodiments below. In some embodiments, the RFDAC circuit 100 facilitates a clean sign change by avoiding data driven transitions. In some embodiments, the array of cells within the RFDAC array circuit 102 may be arranged into a plurality of segments, each segment comprising a set of cells, as shown in FIG. 2. However, in other embodiments, the array of cells may be arranged differently (e.g., no segmented arrangement).

FIG. 2 illustrates a simplified block diagram of an RFDAC circuit 200, according to one embodiment of the disclosure. In some embodiments, the RFDAC circuit 200 comprises one possible way of implementation of the RFDAC circuit 100 in FIG. 1. The RFDAC circuit 200 comprises an RFDAC array circuit 201 where the array of cells is arranged into a plurality of segments 202a, 202b . . . 202n. In some embodiments, n can be any number. In some embodiments, each segment of the plurality of segments 202a, 202b . . . 202n comprises a set of cells. In some embodiments, each segment of the plurality of segments 202a, 202b . . . 202n is configured to process input data signals. In some embodiments, each of the segments is further referred to as columns, and therefore, in the embodiments described throughout the disclosure, the term segment and column may be used interchangeably. In some embodiments, the RFDAC array circuit 201 may be included within the RFDAC array circuit 102 in FIG. 1. In such embodiments, one or more segments of the plurality of segments is configured to be selectively activated, in order to process input data signals. In some embodiments, the RFDAC circuit 200 further comprises an LO circuit (similar to the LO circuit 104 in FIG. 1, however, not shown here), a segment control circuit 210 and a control data circuit 212. In some embodiments, the segment control circuit 210 and the control data circuit 212 together forms an input decoder circuit (e.g., the input decoder circuit 106 in FIG. 1). In some embodiments, the LO circuit (e.g., the LO circuit 104 in FIG. 1) may be configured to provide the LO signals 204a, 204b . . . 204n to one or more segments to activate the one or more segments, in order to process the input data. In some embodiments, activating the one or more segments refers to providing the LO signal to the one or more segments (or to all the cells within the one or more segments). In some embodiments, the plurality of segments 202a, 202b . . . 202n may comprise fully active segments (i.e., all cells are enabled), inactive segments (i.e., all cells are disabled) and partially active segments (i.e., some cells are enabled and some cells are disabled). In some embodiments, the segment control circuit 210 is configured to provide segment control signals 206a, 206b . . . 206n to the segments in order to enable all the cells within the segments, based on the input data. In some embodiments, the control data circuit 212 is configured to provide control data signals 208a, 208b . . . 208k to each individual cell within the segments, in order to enable a required number of cells within each segment. In some embodiments, k can be any number. In some embodiments, the segment control signals 206a, 206b . . . 206n and the control data signals 208a, 208b . . . 208k are indicative of the input data.

Figure 4:
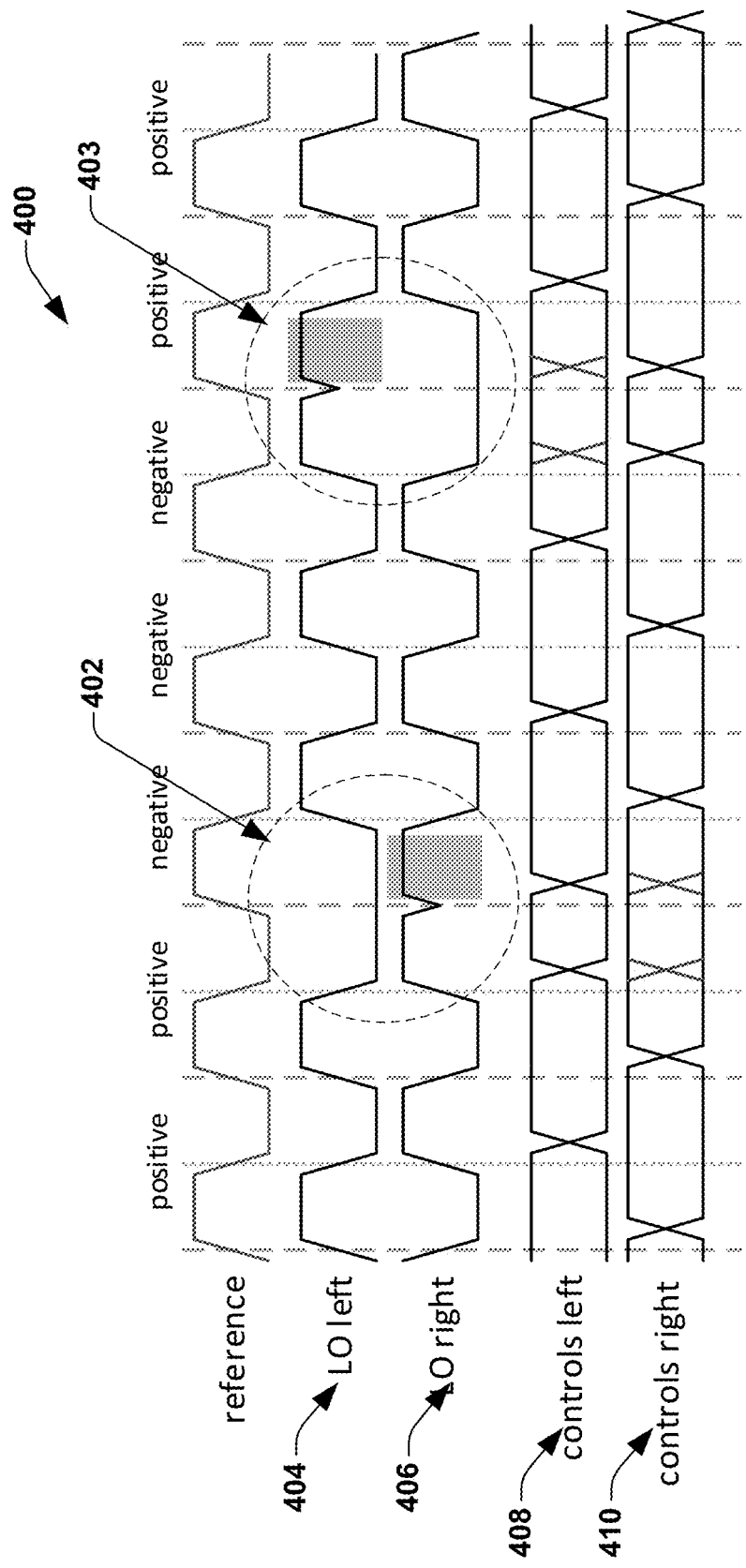
FIG. 4 illustrates a timing diagram associated with an RFDAC array circuit that illustrates the two possible sign-change events, where touching LO transitions occur, according to one embodiment of the disclosure.

In some embodiments, the inactive segments do not get an LO or the LO is de-activated/switched-off and is not toggling, for the inactive segments). Therefore, in some embodiments, the inactive segments do not provide an output (or process input data) regardless of the control signals (i.e., the segment control signals and the control data signals). Further, the fully active segments get an LO while an associated segment control signal indicates that all the cells of the segment are enabled. Furthermore, partially active segments get an LO, have the segment control signal inactive and are thus sensitive to the control data signals 208a, 208b . . . 208n which determines the number of cells of the partially active segment that are active or enabled. During a sign change, for example, during an LO period right after the sign change, the LO signal swaps polarity. In some embodiments, due to the polarity swapping, the LO signal may stay active for a full LO period, referred to herein as a touching LO transition condition, as shown in the timing diagram 400 associated with RFDAC array circuit 200. The timing diagram 400 is depicted herein to illustrate a possible touching LO transition condition associated with a sign change that leads to data driven transitions, which is an undesirable behavior. In particular, the timing diagram 400 depicts two possible sign-change events, where touching LO transitions occur, as can be seen in the highlighted sections 402 and 403, respectively. In this embodiment, the timing diagram 400 in FIG. 4 is depicted with respect to an RFDAC array circuit 201 where the RFDAC cells comprises two equal halves, that is, the left half circuit and the right half circuit, driven with LO's that are phase shifted with respect to one another, to generate the differential RF+ and RF− outputs, as shown in FIG. 3a. In this specific implementation, the LO_left and LO_right are shifted in time by half an LO cycle i.e., 180 deg, and are not strictly differential. Alternately, in other embodiments, the RFDAC array circuit 201 may comprise single ended RFDAC cells. In some embodiments, the timing diagram 400 is with respect to a single segment associated with the RFDAC array circuit 201.

In the above implementation where the RFDAC cell comprises two equal halves, the sign of the input data determines the temporal order of switching of the left half circuit 302a and the right half circuit 302b. In this embodiment, for positive input data, the LO left signal is active for the first half of the LO period and the LO right signal is active for the second half of the LO period, as can be seen in FIG. 3b. Similarly, for negative input data, the LO left signal is active for the second half of the LO period and the LO right signal is active for the first half of the LO period, as can be seen in FIG. 3c. However, the temporal order of switching may be different in different embodiments. Referring back to FIG. 4, during a sign change from positive to negative (the sign changes are shown in the top most line in FIG. 4), the LO right signal 406 and the LO left signal 404 swap polarity. As a result, the LO right signal 406 stays active for a full LO period through the signal transition (i.e., half LO period before the sign change and half LO period after the sign change) and the LO left signal 404 stays inactive for the full LO period through the signal transition, as shown in the highlighted section 402. As can be seen in the highlighted section 402 in FIG. 4, during the positive to negative transition the LO right signal 406 experiences touching LO transition where the LO signal stays active for a full LO period through the signal transition.

Similarly, during a sign change from negative to positive, the LO right signal 406 and the LO left signal 404 swap polarity. As a result, the LO left signal 404 stays active for a full LO period through the signal transition (i.e., half LO period before the sign change and half LO period after the sign change) and the LO right signal 406 stays inactive for the full LO period through the signal transition, as shown in the highlighted section 403. As can be seen in FIG. 4, during the negative to positive transition the LO left signal 404 experiences touching LO transition where the LO signal stays active for a full LO period through the signal transition. In this embodiment, for each sign change, only one of the two LOs (either left or right) experiences touching LO transitions i.e., the LO stays active for a full LO period through the sign transition. Even though the timing diagram 400 is depicted with respect to an implementation where the RFDAC cell comprises two equal halves, the touching LO transitions is also applicable to RFDAC circuits comprising single ended RFDAC cells. In single ended operation, the LO might experience the touching LO transition either during the positive to negative sign change or during the negative to positive sign change, depending on the temporal order of the LO switching.

In some embodiments, during the touching LO transitions, the number of active cells might also change. In some embodiments, the active cells refer to the cells that are enabled. Segments of cells that are fully switched on before and after the sign change have no issue. The LO is simply kept active for these segments, as shown in FIG. 4. These cells are not sensitive to any control data signals, thus a clean transition is achieved. Similarly, fully active segment which are turned off or fully inactive segments which are turned on during a sign change exhibit clean transitions, assuming the LO to this segment is generated properly. However, in some embodiments, in a partially active segment the number of active cells needs to change during a sign change. If the LO to such a partially active segment is kept active for a full LO period (in other words, if a partially active segment experiences touching LO transitions), then the control data signals to the partially active segment initiate the switching of the respective cells, resulting in data driven transitions. In some embodiments, the data driven transitions occur because control data signals (that are needed to enable or disable the RFDAC cells) would need to be perfectly aligned with the LO signal, which is practically impossible.

Therefore, in some embodiments, the RFDAC circuit 200 is configured to operate in a way that none of the partially active segments experiences touching LO transitions (i.e., an LO that is active for a full LO period), during sign change. FIGS. 5a-5d illustrates an RFDAC array circuit 500, according to one embodiment of the disclosure. In some embodiments, the RFDAC array circuit 500 is similar to the RFDAC array circuit 201 in FIG. 2 and is depicted herein to illustrate a method of activation of the cells, in order to achieve a clean sign change. In some embodiments, the RFDAC array circuit 500 facilitates to avoid the touching LO transition condition for partially active segments during a sign change. In some embodiments, the RFDAC array circuit 500 may be included within the RFDAC array circuit 100 in FIG. 1. Therefore, the RFDAC array circuit 500 is explained herein with reference to the RFDAC circuit 100 in FIG. 1 and the RFDAC circuit 200 in FIG. 2. In this embodiment, the RFDAC array circuit 500 comprises RFDAC cells having two equal halves, that is, the left half circuit and the right half circuit, driven with opposite phases of the LO, or LO signals shifted by 180 degrees, to generate the differential RF+ and RF− outputs, as shown in FIG. 3a. However, in other embodiments, the RFDAC array circuit 500 may comprise single ended RFDAC cells. In some embodiments, the RFDAC array circuit 500 comprises an array of cells arranged into a plurality of segments, each segment comprising a set of cells. In some embodiments, each segment of the plurality of segments is configured to process input data signals, as explained above with respect to FIG. 2.

In some embodiments, the RFDAC array circuit 500 is configured to process an input data based on activating a set of segments of the plurality of segments, forming a set of active segments 502a, 502b and 502c, during regular operation, as can be seen in FIGS. 5a and 5b. In some embodiments, the set of active segments comprises fully active segments (e.g., 502a and 502b) and partially active segments (e.g., 502c). In some embodiments, the RFDAC array circuit 500 is configured to process the input data based on a local oscillator signal. In particular, FIGS. 5a and 5b depicts the set of active segments 502a, 502b and 502c during an LO period 510 before sign change. In some embodiments, the RFDAC array circuit 500 is configured to receive the LO signal from an LO circuit (e.g., the LO circuit 104 in FIG. 1). In some embodiments, the LO circuit may be configured to provide the LO signal to each segment of the set of active segments, in order to process input data during regular operation. In some embodiments, the RFDAC array circuit 500 is further configured to receive segment control signals and control data signals, based on the input data, in order to enable/disable cells within the set of active segments. In some embodiments, the RFDAC array circuit 500 is configured to receive the segment control signals from a segment control circuit (e.g., the segment control circuit 210 in FIG. 2) and the control data signals from a control data circuit (e.g., the control data circuit 212 in FIG. 2). In some embodiments, the segment control signals identify the fully active segments 502a and 502b and the control data signals identify a number of active cells within the partially active segment 502c during regular operation.

When the sign of the input data is changed, the RFDAC array circuit 500 is configured to deactivate the partially active segment 502c of the set of active segments and activate a sign change segment 502d within the RFDAC array circuit 500, in order to implement the sign change associated with the input data, as can be seen in FIG. 5c. In some embodiments, the sign change segment 502d is configured to handle the sign change for the partially active segment 502c. In this example embodiment, the RFDAC array circuit 500 is shown to include only one partially active segment, that is the partially active segment 502c. However, in other embodiments, the RFDAC array circuit 500 may include one or more partially active segments. Therefore, in such embodiments, when the sign of the input data is changed, the RFDAC array circuit 500 may be configured to deactivate the one or more partially active segments. Further, in such embodiments, the RFDAC array circuit 500 may comprise one or more sign change segments (instead of just one sign change segment 502d) and the RFDAC array circuit 500 may be configured to activate the one or more sign change segments. In some embodiments, the number of active cells within the partially active segment 502c and the number of active cells within the sign change segment 502d may be different. In some embodiments, the RFDAC array circuit 500 is configured to deactivate the partially active segment 502c and activate the sign change segment 502d, only for a predefined time interval following the sign change of the input data (e.g., for a first half of the LO period following the sign change). In some embodiments, the sign change segment 502d comprises a segment within the plurality of segments of the RFDAC array circuit 500 that is different from the set of active segments 502a, 502b and 502c. In some embodiments, the sign change segment 502d may comprise any segment within the RFDAC array circuit 500 that is different from the set of active segments. In some embodiments, the sign change segment 502d is dynamically chosen from a set of segments within the RFDAC array circuit 500 that was inactive during the previous LO period. In some embodiments, the previous LO period refers to the LO period just prior to the sign change (e.g., the LO period 510 in FIG. 5a and FIG. 5b). However, in other embodiments, the position of the sign change segment may be predefined.

Figure 6:
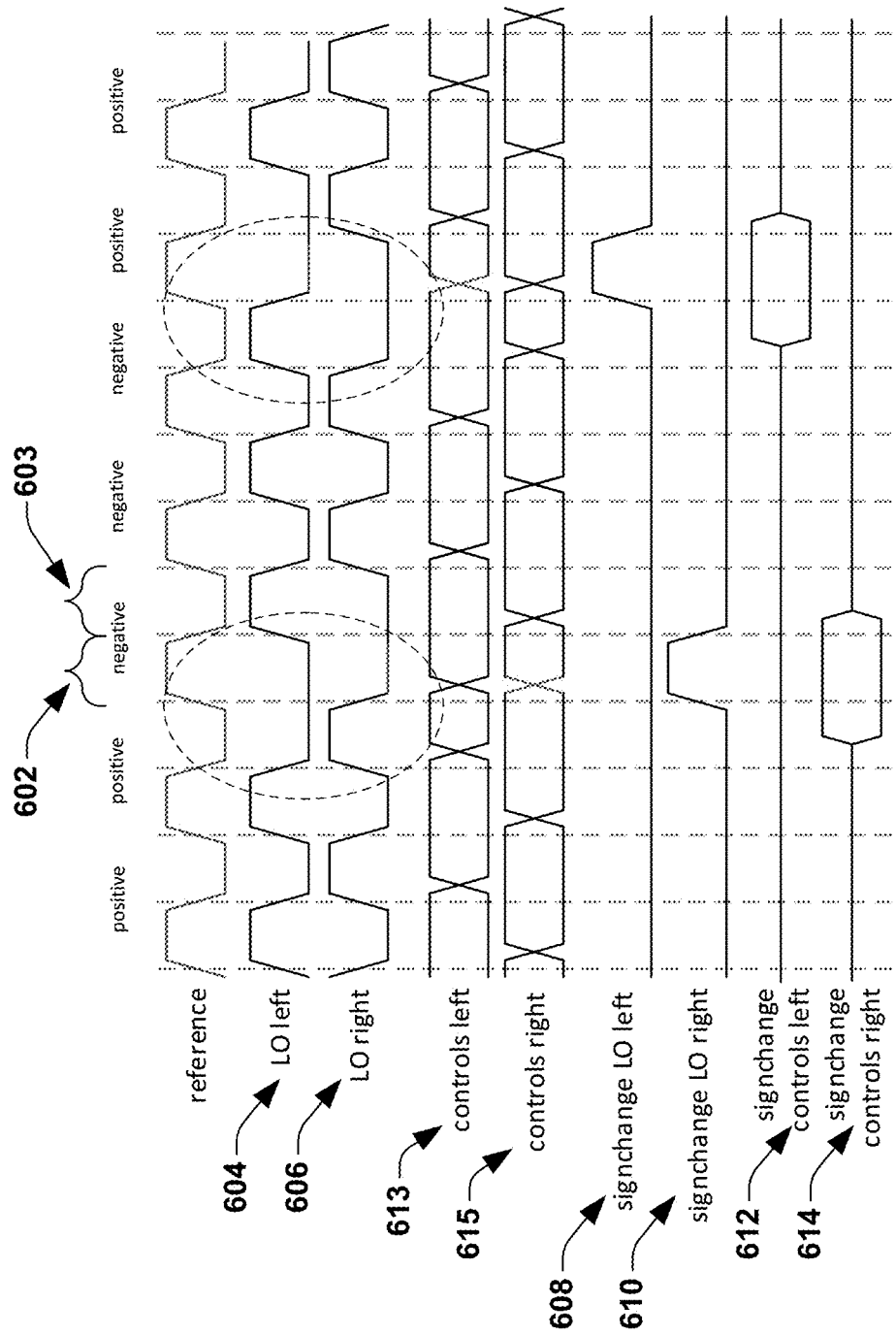
FIG. 6 depicts the timing diagram of the sign switching associated with the partially active segment of the RFDAC array circuit of FIGS. 5a-5d, according to one embodiment of the disclosure.

In such embodiments, the LO circuit (e.g., the LO circuit 104 in FIG. 1) is configured to deactivate the LO signal to the partially active segment (e.g., the LO right signal 606 during the LO period 602 in FIG. 6) and provide a sign change LO signal (e.g., the sign change LO right signal 610) to the sign change segment to activate the sign change segment, during first half of an LO period after the sign change, in order to implement the sign change associated with the input data. In some embodiments, the sign change LO signal has inverted polarity relative to the LO signal. In some embodiments, FIG. 6 depicts the timing diagram 600 of the sign switching associated with the partially active segment 502c of the RFDAC array circuit 500. In implementations where the RFDAC cell comprises two equal half cells, deactivating the partially active segment (when a sign change occurs) comprises deactivating only the half cells that experiences the touching LO transitions associated with the sign change and activating the sign change segment comprises activating only the corresponding half cells associated with the sign change segment. Therefore, as depicted in FIG. 6, during the positive to negative transition, only the right half circuit of the partially active segments experiences touching LO transitions, and therefore, only the right half circuits of the partially active segment 502c is deactivated and only the right half cells of the sign change segment 502d is activated.

Therefore, in this particular embodiment, the LO circuit is configured to deactivate the LO right signal 606 to the partially active segment 502c and provide the sign change LO right signal 610 to the sign change segment 502d to activate the sign change segment, during the first half of the LO period 602 after the sign change. Further, the input decoder circuit (e.g., the input decoder circuit 106 in FIG. 1) is configured to provide a sign change control data signal (e.g., the sign change control right signal 614 in FIG. 6) to the sign change segment 502d, during the first half of the LO period 602 after the sign change. In some embodiments, the sign change control data signal identifies a number of active cells within the sign change segment 502d. In some embodiments, the sign change control data signal is configured to enable one or more cells within the sign change segment 502d. However, in some embodiments, the sign change control data signal may not enable any cells within the sign change segment 502d (for example, in the embodiments where there is a reduction in input data after the sign change). Therefore, in such embodiments, the number of active cells within the sign change segment 502d may be zero. In some embodiments, the sign change control data signal reflects the control data signal to be provided to the partially active segment 502c after the sign change. In some embodiments, utilizing the sign change segment 502d in place of the partially active segment 502c to handle the sign change enables the control data signals to be updated to be in sync with the LO signal during the LO period right after the sign change, thereby avoiding data driven transitions. Further, as a result of this arrangement, no partially active segment within the RFDAC array circuit 500 experiences a touching LO transition.

In some embodiments, the RFDAC array circuit 500 is further configured to deactivate the sign change segment 502d during the second half of the LO period after the sign change 603 (or after a predefined time interval). In some embodiments, the RFDAC array circuit 500 is further configured to selectively reactivate the partially active segment 502c, based on the input data after the sign change, during the second half of the LO period after the sign change 603 (or after the predefined time interval). For example, in this embodiment, the number of fully active segments before and after the sign change is assumed to be the same, and that the change in input data is assumed to be limited to one segment. Therefore, in this embodiment, the partially active segment 502c is reactivated during the second half of the LO period after the sign change 603. However, in some embodiments, if the input data is reduced with the sign change, (i.e., none of the cells in the partially active segment needs to be active to handle the input data after the sign change), the partially active segment 502c may not be reactivated. Further, in some embodiments, if the input data is increased with the sign change, (i.e., all of the cells in the partially active segment needs to be active to handle the input data after the sign change and one or more additional segments), the partially active segment 502c is reactivated after the predefined time interval. Further, in such embodiments, the RFDAC array circuit 500 may be configured to activate the one or more additional segments after the sign change. In such embodiments, the LO circuit is configured to deactivate the sign change LO signal (e.g., the sign change LO right signal 610 in FIG. 6) in the LO period 603. In some embodiments, the LO circuit is further configured to selectively reactivate the LO signal (e.g., the LO right signal 606 in FIG. 6) in the LO period 603, based on the input data after the sign change. In some embodiments, the LO signal after the sign change comprises an updated LO signal having an inverted polarity relative to the LO signal before the sign change. Further, the input decoder circuit is configured to deactivate the sign change control data signal 614 to the sign change segment 502d in the LO period 603.

Figure 7:
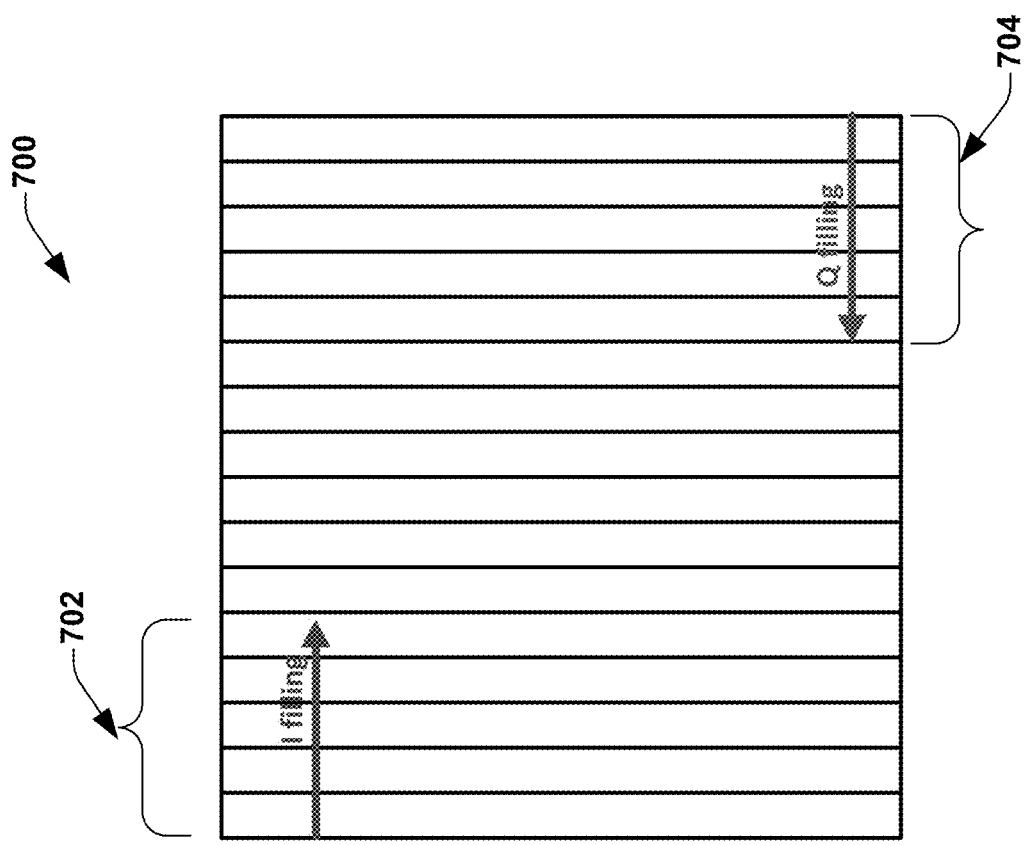
FIG. 7 illustrates an RFDAC array circuit configured to support quadrature (IQ) operation, according to one embodiment of the disclosure.

FIG. 7 illustrates an RFDAC array circuit 700 configured to support quadrature operation. In some embodiments, the principle of operation of the RFDAC array circuit 700 is similar to the RFDAC array circuit 500 in FIG. 5. In some embodiments, the RFDAC array circuit 700 may be included within the RFDAC array circuit 201 in FIG. 2 and the RFDAC array circuit 102 in FIG. 1 and is therefore explained herein with reference to the RFDAC circuit 200 and the RFDAC circuit 100. In some embodiments, the RFDAC array circuit 700 is similar to the RFDAC array circuit 201 comprising an array of cells arranged into a plurality of segments, each segment comprising a set of cells. In some embodiments, the RFDAC array circuit 700 is configured to process an I-phase input data based on activating a set of segments of the plurality of segments of the RFDAC array circuit 700, forming a set of I-phase segments 702, in accordance with an I-phase local oscillator (LO) signal.

In some embodiments, the RFDAC array circuit 700 is further configured to process a Q-phase input data based on activating a set of segments of the plurality of segments of the RFDAC array circuit 700, forming a set of Q-phase segments 704, in accordance with a Q-phase local oscillator (LO) signal. In such embodiments, an LO circuit (e.g., the LO circuit 104 in FIG. 1) may be configured to provide the I-phase LO signal and the Q-phase LO signal. Further, in such embodiments, a control data circuit (e.g., the control data circuit 212 in FIG. 2) may be configured to provide I-phase control data signals and Q-phase control data signals, based on I-phase input data and the Q-phase input data. Furthermore, a segment control circuit (e.g., the segment control circuit 210 in FIG. 2) may be configured to provide I-phase segment control signals and Q-phase segment control signals, based on I-phase input data and Q-phase input data.

When a sign change associated with the I-phase input data occurs, in some embodiments, the RFDAC array circuit 700 is configured to deactivate a partially active segment within the set of I-phase segments and activate an I-phase sign change segment within the RFDAC array circuit, similar to the procedure explained above with respect to the RFDAC circuit 500 above. In some embodiments, the I-phase sign change segment comprises a segment within the plurality of segments of the RFDAC array circuit 700 that is different from the set of I-phase segments and the set of Q-phase segments. In some embodiments, when a sign change associated with the Q-phase input data occurs, the RFDAC array circuit 700 is configured to deactivate a partially active segment within the set of Q-phase segments and activate a Q-phase sign change segment within the RFDAC array circuit, similar to the procedure explained above with respect to the RFDAC circuit 500 above. In some embodiments, the Q-phase sign change segment comprises a segment within the plurality of segments of the RFDAC array circuit 700 that is different from the set of Q-phase segments and the set of I-phase segments.

In such embodiments, the LO circuit is further configured to deactivate the I-phase LO signal to the I-phase partially active segment and provide an I-phase sign change LO signal to the I-phase sign change segment, during an LO period after the sign change, in order to implement the sign change associated with the I-phase input data. Similarly, in such embodiments, the LO circuit is further configured to deactivate the Q-phase LO signal to the Q-phase partially active segment and provide a Q-phase sign change LO signal to the Q-phase sign change segment, during an LO period after the sign change, in order to implement the sign change associated with the Q-phase input data. In addition, in such embodiments, the input decoder circuit is configured to provide an I-phase sign change control data signal to the I-phase sign change segment. In some embodiments, the I-phase sign change control data signal identifies a number of active cells within the I-phase sign change segment. Further, the input decoder circuit is configured to provide a Q-phase sign change control data signal to the Q-phase sign change segment. In some embodiments, the Q-phase sign change control data signal identifies a number of active cells within the Q-phase sign change segment.

Figure 8D:
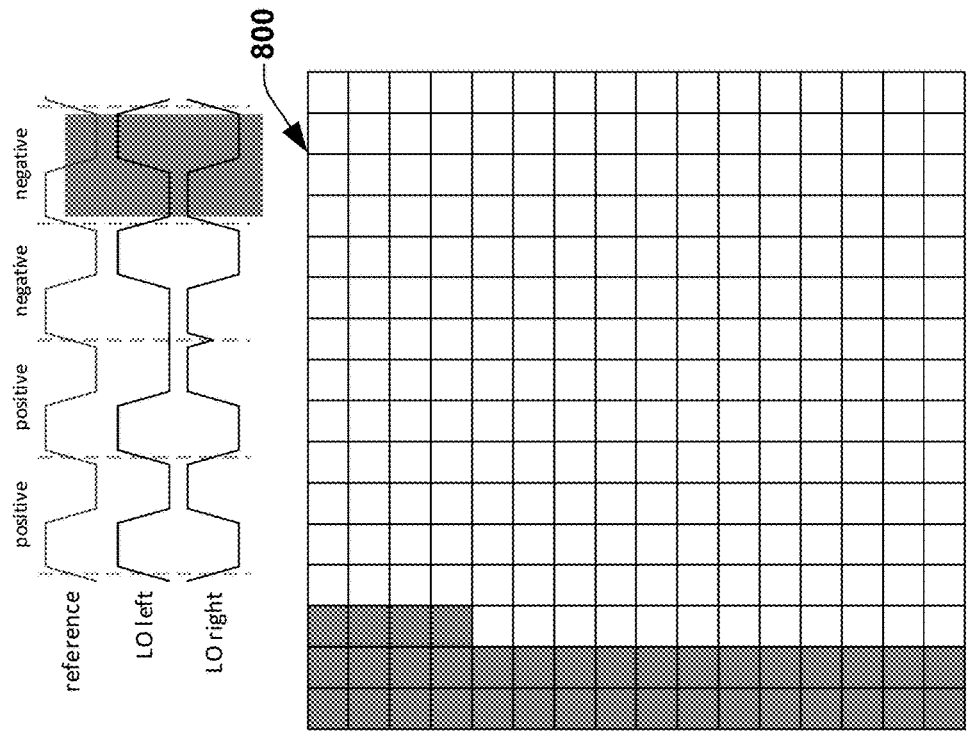
Figure 8C:
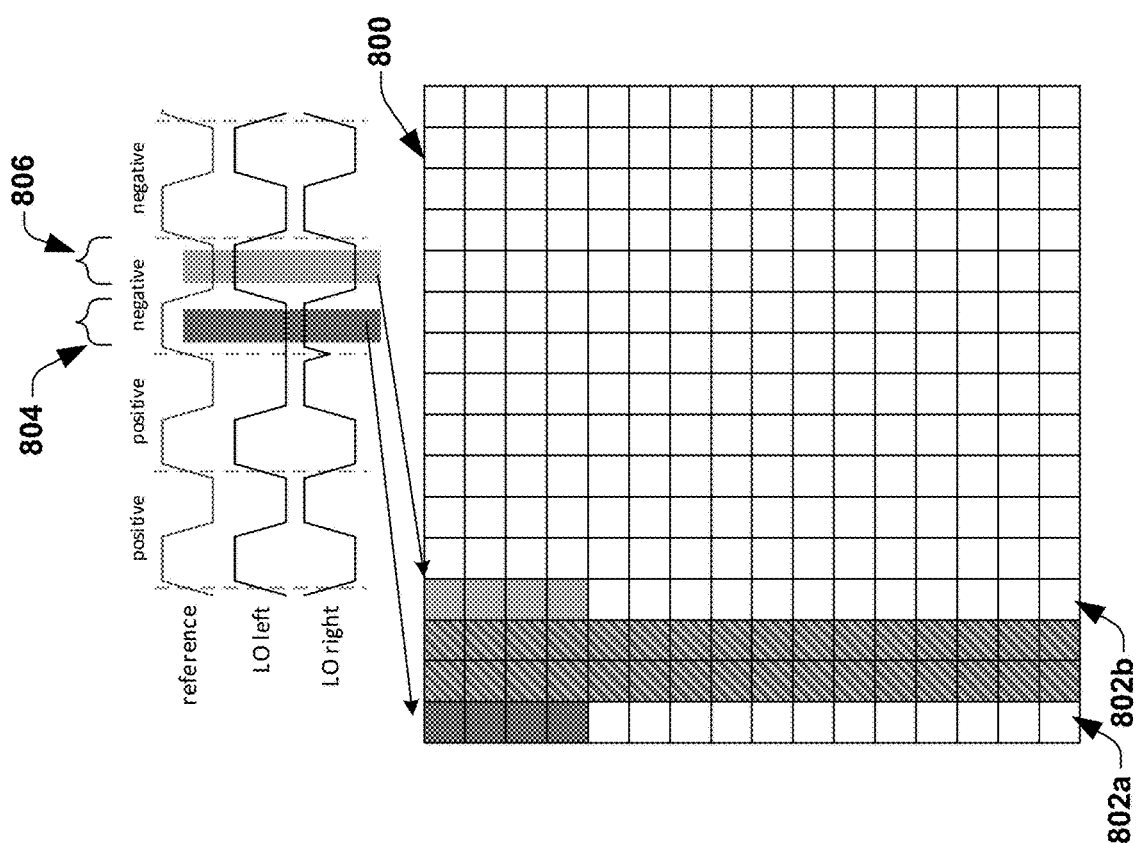

FIGS. 8a-8d depicts one possible implementation of a sign switching procedure associated with I-phase input data in the RFDAC array circuit 800. In some embodiments, the RFDAC array circuit 800 is similar to the RFDAC array circuit 700 in FIG. 7 and is therefore explained with reference to FIG. 7. In some embodiments, the I-phase segments are filled from left to right, during regular operation, as shown in FIG. 8. In this embodiment, the left most segment 802a is utilized as the I-phase sign change segment. However, in other embodiments, the I-phase sign change segment may comprise any segment within the plurality of segments of the RFDAC array circuit that is different from the set of I-phase segments and the set of Q-phase segments. In order to utilize the left most segment 802a as the I-phase sign change segment, in this embodiment, the RFDAC array circuit 800 is configured to shift, during an LO period prior to the sign change, the set of I-phase segments in such a way that the left most segment 802a is empty prior to the sign change, as shown in FIG. 8b. Further, during a first half of the LO period after the sign change 804, the partially active segment 802b is deactivated and the I-phase sign change segment 802a is activated to handle the sign change, as shown in FIG. 8c. Further, in the second half of the LO period after the sign change 806, the I-phase sign change segment 802a is deactivated and the partially active segment 802b is reactivated, as shown in FIG. 8c. Furthermore, after two or more LO periods after the sign change, the set of I-phase segments are shifted back to the original position, as shown in FIG. 8d. The above implementation is only one possible implementation and is not to be construed to be limiting. In other embodiments, the sign switching may be implemented without shifting the set of I-phase segments, based on utilizing any available segment (I-phase or Q-phase) to handle the sign change, as explained above with respect to FIGS. 5a-5d above. Further, the above procedure is equally applicable to sign switching associated with Q-phase segments.

Figure 9:
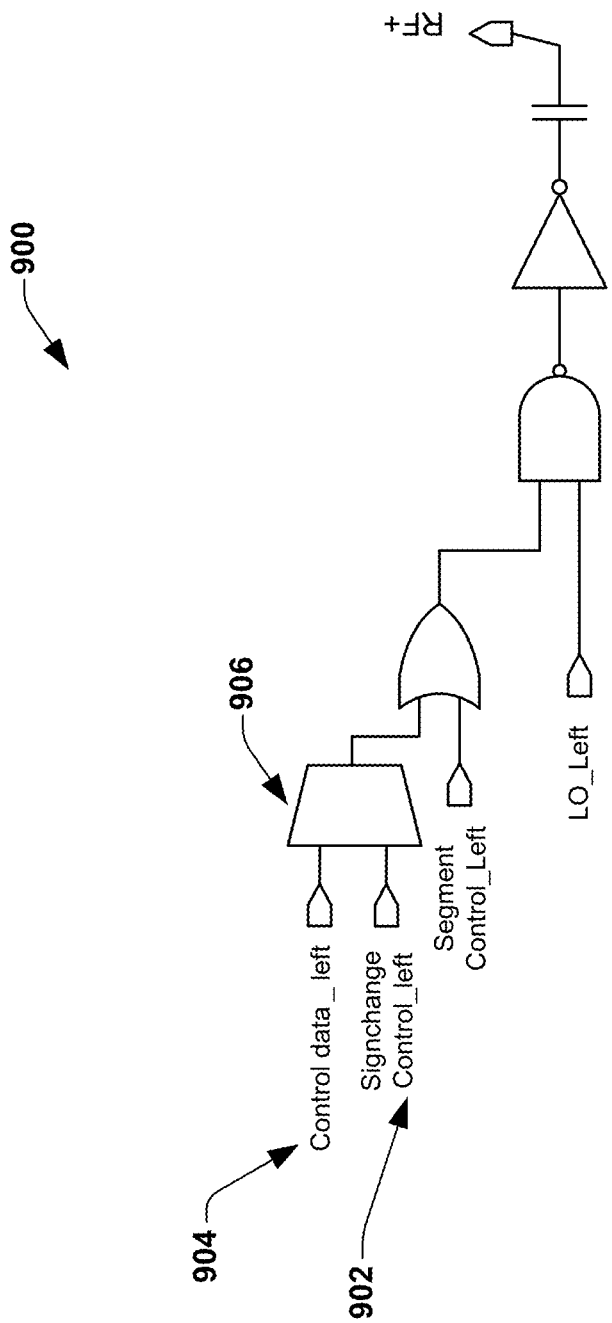
FIG. 9 illustrates a possible implementation of an RFDAC cell that supports a sign change control data signal, according to one embodiment of the disclosure.

FIG. 9 illustrates a possible implementation of an RFDAC cell 900 that supports the sign change control data signal (e.g., the sign change control left signal 612 in FIG. 6 or the sign change control right signal 614 in FIG. 6), according to one embodiment of the disclosure. In some embodiments, the RFDAC cell 900 may be included within any of the RFDAC array circuits described in the embodiments above. As can be seen in FIG. 9, the RFDAC cell 900 comprises a dedicated trace 902 for the sign change control data signal (e.g., the sign change control left signal 612 in FIG. 6). Further, the RFDAC cell 900 comprises a multiplexer 906 coupled to the sign change control data signal trace 902 and a regular control data signal trace 904. In some embodiments, the multiplexer circuit 906 is configured to choose between the sign change control data signal trace 902 and a regular control data signal trace 904, in order to receive the appropriate control signals during sign change. In this implementation, only the left half circuit of an RFDAC cell is depicted. However, the above implementation is also applicable to the right half circuit of RFDAC cells. Furthermore, in other embodiments, the above implementation can be applied to single ended RFDAC cells as well.

FIG. 10a illustrates an implementation of an RFDAC array circuit 1000 that supports the sign change control data signal (e.g., the sign change control left signal 612 in FIG. 6 or the sign change control right signal 614 in FIG. 6), according to one embodiment of the disclosure. In some embodiments, the RFDAC array circuit 1000 may be included within any of the RFDAC array circuits described in the embodiments above. In this embodiment, the RFDAC array circuit 1000 is divided into two portions comprising a first RFDAC array portion 1002a and a second RFDAC array portion 1002b. In some embodiments, the number of segments in the first array portion 1002a and the second array portion 1002b may be different. In some embodiments, the first array portion 1002a is configured to include the partially active segment as can be seen in FIG. 10b and the second array portion 1002b is configured to include the sign change segment as can be seen in FIG. 10c. In such embodiments, a control data circuit (e.g., the control data circuit 212 in FIG. 2) may be configured to split the generation of the control signals to be provided to the RFDAC array circuit 1000. In particular, the control data circuit may be configured to generate control data signals (e.g., the control data signals 613 and 615 in FIG. 6) to be provided to the first array portion 1002a (comprising the partially active segment) during regular operation and generate signal change control signals (e.g., the sign change control data signals 612 and 614 in FIG. 6) to be provided to the second array portion 1002b (comprising the sign change segment), during sign change.

Figure 11A:
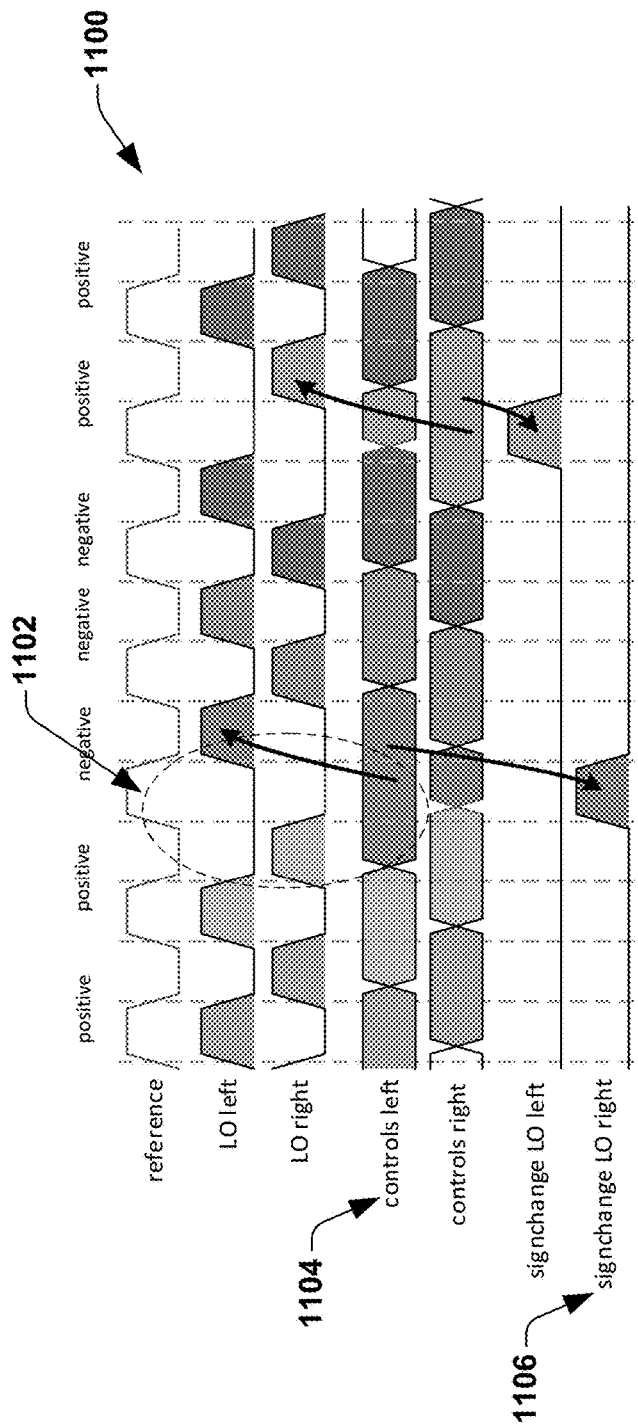
FIG. 11a illustrates a timing diagram that depicts the generation of the sign change control data signals, according to one embodiment of the disclosure.

FIG. 11a illustrates a timing diagram 1100 that depicts the generation of the sign change control data signals (e.g., the sign change control left signal 612 in FIG. 6 or the sign change control right signal 614 in FIG. 6), according to one embodiment of the disclosure. In some embodiments, the proposed principle is only applicable to RFDAC cells having two equal halves, that is, a left hand circuit an right hand circuit, as shown in FIG. 3a. In some embodiments, during a sign change, the sign change segment (e.g., the sign change segment 502d in FIG. 5c) is configured to use the control data signal of half cells that is not experiencing touching LO transitions as the sign change control data signal. In other words, when the touching LO transition occurs on the right side of the cell, the control data signals of the left side of the RFDAC cell is used as the sign change control data signal, and vice versa. In particular, as can be seen in the highlighted portion 1102 in FIG. 11a, during a sign change from positive to negative, the control data signals of the left side of the RFDAC cell (i.e., the controls left 1104) is reused as the sign change control data signal (for the sign change LO right 1106).

Figure 11B:
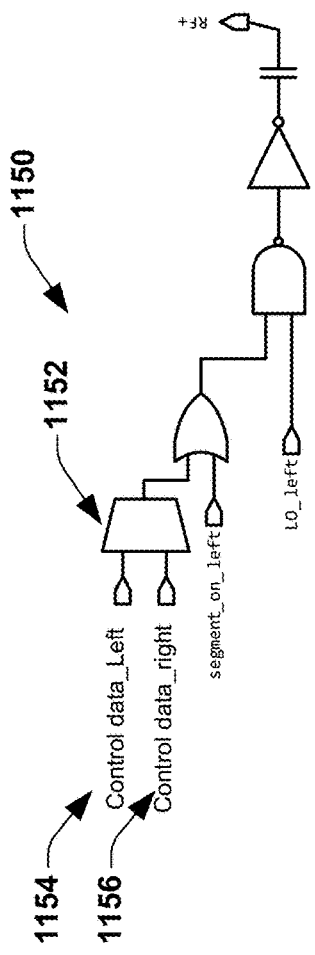
FIG. 11b illustrates a possible implementation of an RFDAC cell that supports the control signal as illustrated in FIG. 11a, according to one embodiment of the disclosure.

FIG. 11b illustrates a possible implementation of an RFDAC cell 1150 that supports generation of sign change control data signal as illustrated in FIG. 11a, according to one embodiment of the disclosure. In some embodiments, the RFDAC cell 1150 may be included within any of the RFDAC array circuits described in the embodiments above. As can be seen in FIG. 11b, the RFDAC cell 1150 comprises a multiplexer 1152 configured to receive both control data signal left 1154 and the control data signal right 1156. In some embodiments, the multiplexer 1152 is configured to choose between control data signal left 1154 and the control data signal right 1156 to support regular operation or sign change operation. In this implementation, the only the left half circuit of an RFDAC cell is depicted. However, the above implementation is also applicable to the right half circuit of RFDAC cells.

Figure 11C:
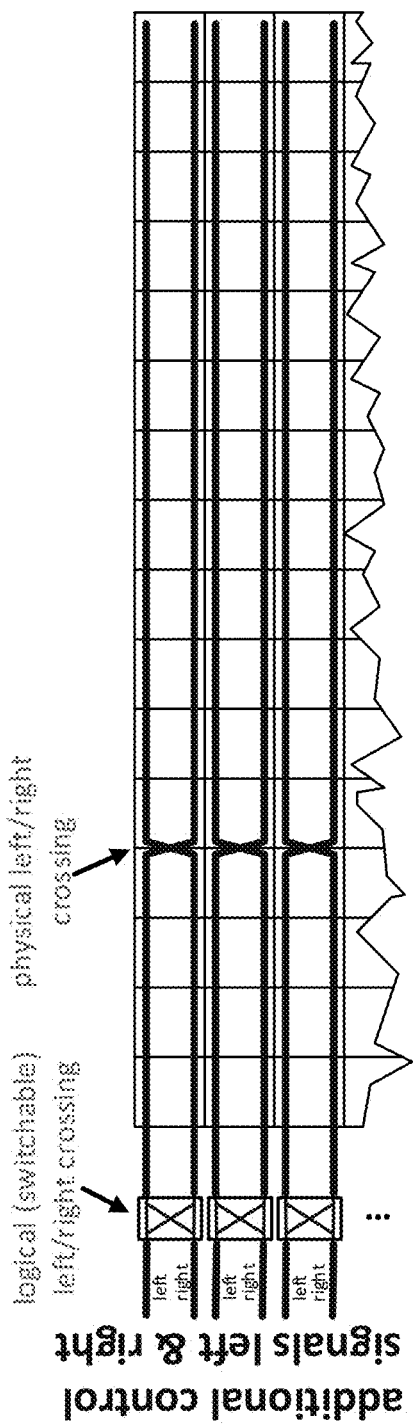
FIG. 11c illustrates a possible implementation of an RFDAC array circuit that supports the principle of generation of sign change control data signal as illustrated in FIG. 11a, according to one embodiment of the disclosure.

FIG. 11c illustrates a possible implementation of an RFDAC array circuit 1170 that supports the principle of generation of sign change control data signal as illustrated in FIG. 11a, according to one embodiment of the disclosure. In some embodiments, the RFDAC array circuit 1170 may be included within any of the RFDAC array circuits described in the embodiments above. Instead of multiplexing between the left and right control signals locally in the individual cells (as shown in FIG. 11b above), the left control signal and right control signal are multiplexed, for certain segments, as sketched in 11c. The sign change segment handling the touching LO pulse during the sign change, must have the control signals swapped (left/right) with respect to the segment that is partially active right before the sign change. The left and right control signals are multiplexed upfront in order to be logically swapped when needed i.e., depending on the location of the partially active segment during normal operation or during sign-change operation.

FIG. 12a illustrates an RFDAC array circuit 1200, according to one embodiment of the disclosure. In some embodiments, the RFDAC array circuit 1200 illustrates another possible way of implementation of the RFDAC array circuit 201 in FIG. 2. In some embodiments, the RFDAC array circuit 1200 facilitates to avoid the touching LO transition condition for partially active segments during sign change, thereby preventing data driven transitions. In some embodiments, the RFDAC array circuit 1200 may be included within the RFDAC array circuit 100 in FIG. 1. Therefore, the RFDAC array circuit 1200 is explained herein with reference to the RFDAC circuit 100 in FIG. 1 and the RFDAC circuit 200 in FIG. 2. In some embodiments, the RFDAC array circuit 1200 comprises RFDAC cells having two equal halves, that is, the left half circuit and the right half circuit, driven with opposite phases of the LO, or LO signals shifted by 180 degrees, to generate the differential RF+ and RF− outputs, as shown in FIG. 3a. Alternately, in other embodiments, the RFDAC array circuit 1200 may comprise single ended RFDAC cells.

In some embodiments, the RFDAC array circuit 1200 comprises an array of cells arranged into a plurality of segments, each segment comprising a set of cells. In some embodiments, each segment of the plurality of segments is configured to process input data signals, as explained above with respect to FIG. 2. In some embodiments, the plurality of segments within the RFDAC array circuit 1200 comprises a dedicated negative segment 1202 configured to process only negative input data signals. Therefore, in some embodiments, the dedicated negative segment 1202 is inactive (or empty), when the RFDAC array circuit 1200 is processing positive input data signals. Further, the plurality of segments within the RFDAC array circuit 1200 comprises a dedicated positive segment 1204 configured to process only positive input data signals. Therefore, in some embodiments, the dedicated positive segment 1204 is inactive (or empty), when the RFDAC array circuit 1200 is processing negative input data signals. In other embodiments, the position of the dedicated negative segment 1202 and the dedicated positive segment 1204 may be different from the position depicted in FIG. 12a.

In some embodiments, the RFDAC array circuit 1200 is configured to process an input data based on activating a set of segments of the plurality of segments, forming a set of active segments 1203, during regular operation, similar to the RFDAC array circuit 500 in FIGS. 5a-5d above. In some embodiments, the set of active segments comprises fully active segments and partially active segments (e.g., 1203a). Though not shown in this embodiment, in other embodiments, when the input data comprises positive input data, the set of active segments may comprise one or more of the plurality of segments (including the dedicated positive segment 1204) except the dedicated negative segment. Similarly, when the input data comprises negative input data, the set of active segments may comprise one or more of the plurality of segments (including the dedicated negative segment 1202) except the dedicated positive segment. In some embodiments, the RFDAC array circuit 1200 is configured to process the input data based on a local oscillator signal. In some embodiments, the RFDAC array circuit 1200 is configured to receive the LO signal from an LO circuit (e.g., the LO circuit 104 in FIG. 1). In some embodiments, the LO circuit may be configured to provide the LO signal to each segment of the set of active segments, in order to process input data during regular operation. In some embodiments, the RFDAC array circuit 1200 is further configured to receive segment control signals and control data signals, based on the input data, in order to enable cells within the set of active segments, as explained above with respect to FIG. 2. In some embodiments, the RFDAC array circuit 1200 is configured to receive the segment control signals from a segment control circuit (e.g., the segment control circuit 210 in FIG. 2) and the control data signals from a control data circuit (e.g., the control data circuit 212 in FIG. 2), as explained above with respect to FIG. 2.

When a sign of the input data is changed, the RFDAC array circuit 1200 is configured to deactivate a partially active segment 1203a of the set of active segments and activate a sign change segment (either one of the dedicated negative segment 1202 or the dedicated positive segment 1204 depending on the associated sign change) within the RFDAC array circuit 1200, in order to implement the sign change associated with the input data. In particular, during a positive to negative transition of the input data, the RFDAC array circuit 1200 is configured to deactivate the partially active segment 1203a of the plurality of active segments and activate the dedicated negative segment 1202 (which is empty before the sign change), in order to implement the sign change, thereby avoiding the touching LO transition associated with the partially active segment, as can be seen in FIG. 12b. In some embodiments, FIG. 12b depicts the RFDAC array circuit 1200 after a positive to negative transition. As can be seen in FIG. 12b, the dedicated negative segment 1202 is activated to handle the positive to negative sign change. Therefore, during a positive to negative transition of the input data, the dedicated negative segment 1202 comprises the sign change segment.

Similarly, during a negative to positive transition of the input data, the RFDAC array circuit 1200 is configured to deactivate the partially active segment 1203a of the plurality of active segments and activate the dedicated positive segment 1204 (which is empty before the sign change), in order to implement the sign change, thereby avoiding the touching LO transition associated with the partially active segment, as can be seen in FIG. 12c. In some embodiments, FIG. 12c depicts the RFDAC array circuit 1200 after a negative to positive transition. As can be seen in FIG. 12c, the dedicated positive segment 1204 is activated to handle the negative to positive sign change. Therefore, during a negative to positive transition of the input data, the dedicated positive segment 1204 comprises the sign change segment. In some embodiments, the number of active cells within the partially active segment and the number of active cells within the sign change segment may be different. In some embodiments, the RFDAC array circuit 1200 is configured to deactivate the partially active segment and activate the sign change segment, only for a predefined time interval following the sign change of the input data (e.g., for a first half of the LO period following the sign change).

In such embodiments, the LO circuit (e.g., the LO circuit 104 in FIG. 1) is configured to deactivate the LO signal to the partially active segment 1203a and provide a sign change LO signal to the sign change segment (i.e., either the dedicated negative segment 1202 or the dedicated positive segment 1204) to activate the sign change segment, in order to implement the sign change associated with the input data, similar to the explanation with respect to the RFDAC array circuit in FIGS. 5a-5d above. In some embodiments, the sign change LO signal has inverted polarity relative to the LO signal. In some embodiments, the LO circuit is configured to deactivate the LO signal to the partially active segment 1203a and provide the sign change LO signal to the sign change segment only for the predefined time interval after the sign change. Further, the control data circuit (e.g., the control data circuit 212 in FIG. 2) is configured to provide a sign change control data signal to the sign change segment. In some embodiments, the sign change control data signal identifies a number of active cells within the sign change segment. In some embodiments, the sign change control data signal is configured to enable one or more cells within the sign change segment, in order to implement the sign change. However, in some embodiments, the sign change control data signal may not enable any cells within the sign change segment (e.g., in the embodiments where there is a reduction in the input data after the sign change). Therefore, in such embodiments, the number of active cells within the sign change segment may be zero. In some embodiments, the sign change control data signal reflects the control data signal to be provided to the partially active segment 1203a after the sign change. In some embodiments, utilizing the sign change segment in place of the partially active segment 1203a to handle the sign change enables the control data signals to be updated in sync with the LO signal during the LO period right after the sign change, thereby avoiding data driven transitions. Further, as a result of this arrangement, no partially active segment within the RFDAC array circuit 1200 experiences a touching LO transition. In some embodiments, the RFDAC array circuit 1200 is further configured to deactivate the sign change segment, after a predefined time interval after the sign change. In some embodiments, the RFDAC array circuit 1200 is further configured to selectively reactivate the partially active segment 1203a, based on the input data change, as explained above with respect to FIG. 5d above. In such embodiments, the LO circuit is configured to deactivate the sign change LO signal, after the predefined time interval. Further, the LO circuit is configured to selectively reactivate the LO signal to the partially active segment 1203a, after the predefined time interval. Further, the control data circuit is configured to deactivate the sign change control data signal to the sign change segment, after the predefined time interval. In some embodiments, the control data circuit is further configured to provide updated control data signals (reflecting the sign change) to the partially active segment 1203a, after the predefined time interval.

Figure 13A:
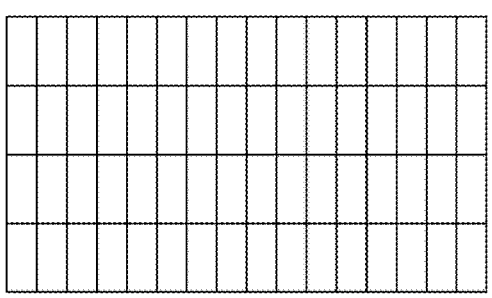
FIG. 13a illustrates an exemplary RFDAC array circuit arranged in four columns of sixteen cells each, according to one embodiment of the disclosure.

FIG. 13a illustrates an RFDAC array circuit 1300, according to one embodiment of the disclosure. In some embodiments, the RFDAC array circuit 1300 illustrates another possible way of implementation of the RFDAC array circuit 201 in FIG. 2. In some embodiments, the RFDAC array circuit 1300 facilitates to avoid the touching LO transition condition for partially active segments during sign change, thereby preventing data driven transitions. In some embodiments, the RFDAC array circuit 1300 may be included within the RFDAC array circuit 100 in FIG. 1. Therefore, the RFDAC array circuit 1300 is explained herein with reference to the RFDAC circuit 100 in FIG. 1 and the RFDAC circuit 200 in FIG. 2. In some embodiments, the RFDAC array circuit 1300 comprises an array of cells arranged into a plurality of segments, each segment comprising a set of cells. In some embodiments, each segment of the plurality of segments is configured to process input data signals, as explained above with respect to FIG. 2. In some embodiments, each of the segments is further referred to as columns, and therefore, in the embodiments described herein the term segment and column are used interchangeably. In this embodiment, the RFDAC array circuit 1300 is shown to include only 4 columns, col 0, col 1, col2 and col 3. However, in other embodiments, the RFDAC array circuit 1300 may comprise any number of columns. In some embodiments, the RFDAC array circuit 1300 comprises RFDAC cells having two equal halves, that is, the left half circuit and the right half circuit, driven with opposite phases of the LO, or LO signals shifted by 180 degrees, to generate the differential RF+ and RF− outputs, as shown in FIG. 3*a*. Alternately, in other embodiments, the RFDAC array circuit 1200 may comprise single ended RFDAC cells.

Figure 13B:
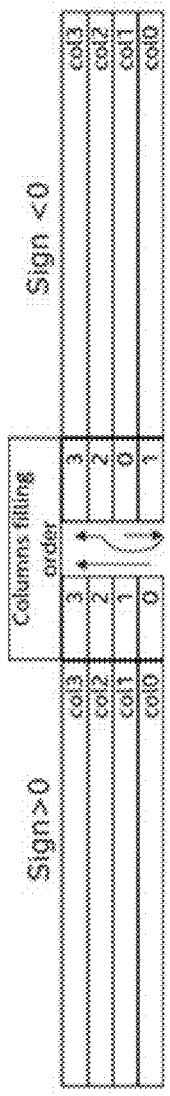
FIGS. 13b and 13c illustrates two different filling order tables, according to one embodiment of the disclosure.
Figure 13C:
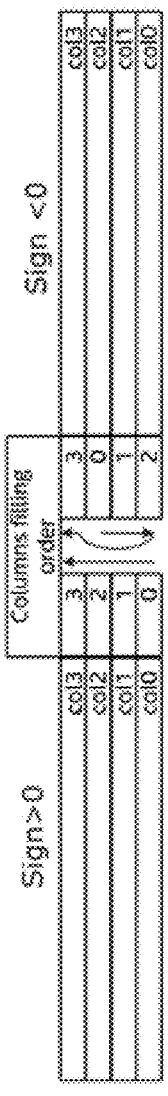

In some embodiments, RFDAC array circuits (e.g., the RFDAC array circuit 1300) comprises a filling order associated therewith. In some embodiments, the filling order refers to a predefined order in which the plurality of segments or columns associated with the RFDAC array circuits are configured to be filled or activated in order to process input data. In order to avoid data driven transitions, in some embodiments, the RFDAC array circuit 1300 is configured to process an input data based on activating one or more columns of the plurality of columns, in accordance with a predefined first filling order, when the sign of the input data is positive. Further, the RFDAC array circuit 1300 is configured to process the input data based on activating one or more columns of the plurality of columns, in accordance with a predefined second filling order, when the sign of the input data is negative. As can be seen in FIG. 13*b*, in one example embodiment, the first column to be filled is "col 0" when the sign of the input data is positive, while it is "col 1" when the sign of the input data is negative. Therefore, in this example embodiment, the first predefined filling order comprises Col0 Col1→Col2→Col3, and the second predefined filling order comprises Col1 Col0→Col2→Col3. In another example embodiment, as can be seen in FIG. 13*c*, the first predefined filling order comprises Col0→Col1→Col2 Col3, and the second predefined filling order comprises Col2→Col1→Col0→Col3. In some embodiments, the one or more columns activated to process positive input data and the one or more columns activated to process negative input data may be different, depending on the filling order.

In some embodiments, the predefined first filling order and the predefined second filling order may differ by one or more columns depending on the code variation associated with the sign change. In some embodiments, the code variation associated with the sign change corresponds to the number of cells that need to be activated or deactivated with the sign change. In some embodiments, the number of cells that needs to be activated or deactivated with a sign change may be more or less than one column. For example, in some embodiments, if the code variation (indicative of the input data change) associated with the sign change is less than one column, the predefined first filling order and the predefined second filling order may differ by just one column as shown in the filling order table 1320 in FIG. 13*b*. However, if the code variation (indicative of the input data change) associated with the sign change is more than one column (e.g., 2 columns), the predefined first filling order and the predefined second filling order may differ by more than one column as shown in the filling order table 1350 in FIG. 13*c*. In order to support the proposed idea, in some embodiments, an input decoder circuit (e.g., the input decoder circuit 106 in FIG. 1) is configured to provide a first set of control signals (e.g., the segment control signals or control data signals or both explained above with respect to FIG. 2) to activate the one or more columns of the plurality of columns in accordance with the predefined first filling order, when the sign of the input data is positive. In some embodiments, the input decoder circuit is further configured to provide a second, different, set of control signals to activate the one or more columns of the plurality of columns in accordance with the predefined second filling order, when the sign of the input data is negative. In some embodiments, an LO circuit (e.g., the LO circuit 104 in FIG. 1) is configured to provide LO signals to the one or more columns of the plurality of columns, in order to activate the one or more columns in accordance with the first predefined filling order or the second predefined filling order.

Figure 14A:
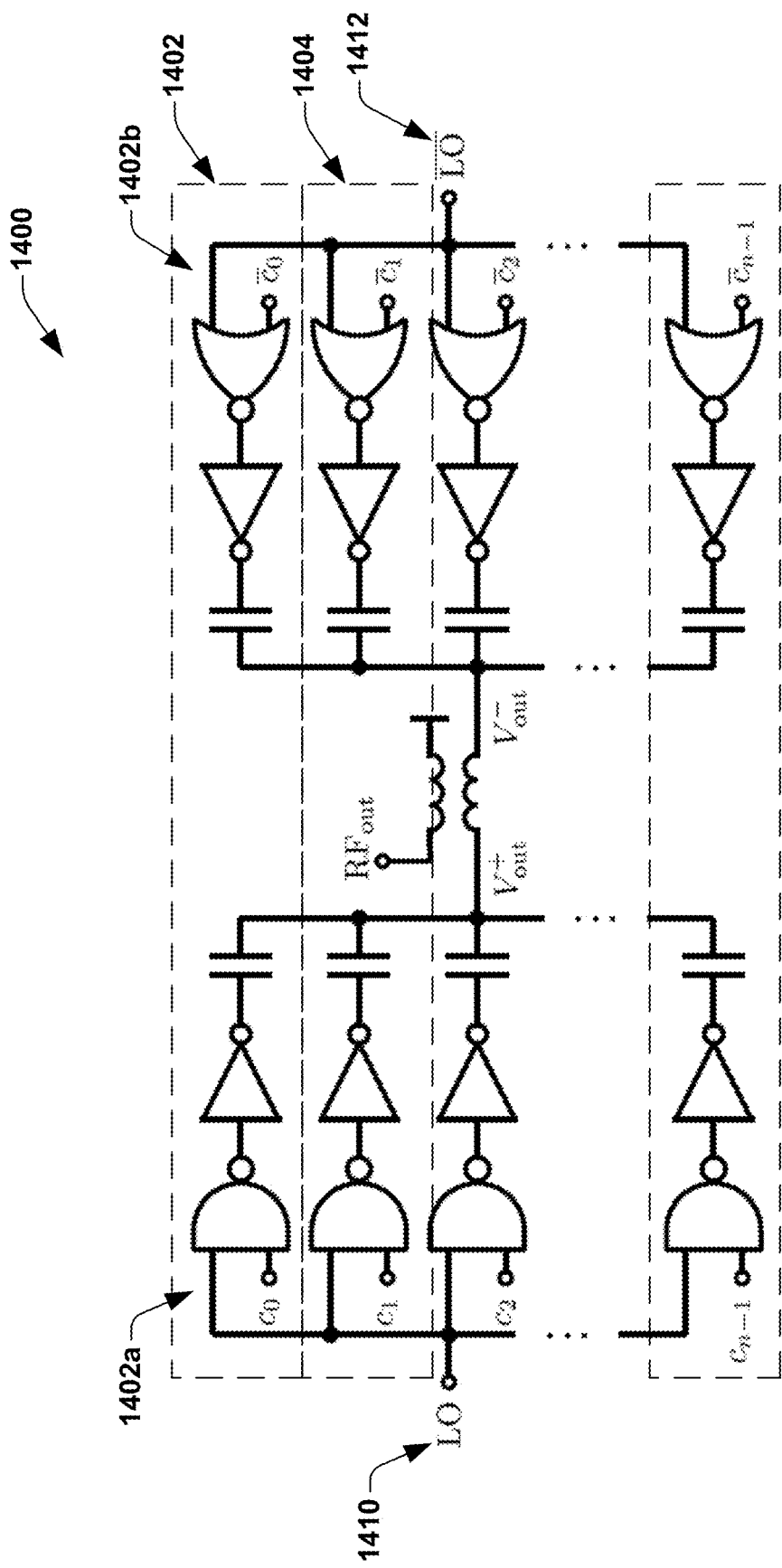
FIG. 14a illustrates a differential RFDAC array circuit, according to one embodiment of the disclosure.

FIG. 14*a* illustrates a differential RFDAC array circuit 1400, according to one embodiment of the disclosure. In some embodiments, the differential RFDAC array circuit 1400 may be part of an RFDAC circuit (e.g., the RFDAC circuit 100 in FIG. 1). In the embodiments described herein, an RFDAC circuit that utilizes a differential RFDAC array circuit is referred to as a differential RFDAC circuit. In some embodiments, the RFDAC array circuit 1400 comprises one possible way of implementation of the RFDAC array circuit 102 in FIG. 1. In some embodiments, the RFDAC array circuit 1400 comprises an array of differential cells 1402, 1404 etc. configured to be selectively activated, in order to process input data, that is, to perform digital to analog conversion of input data. In some embodiments, each differential cell of the array of differential cells comprises a first half cell circuit (e.g., the first half cell circuit 1402*a*) and a second half cell circuit (e.g., the second half cell circuit 1402*b*). In some embodiments, the first half cell circuits and the second half cell circuits are driven by a local oscillator (LO) signal LO 1410 and an inverse LO signal $\overline{LO}$ 1412, respectively. In some embodiments, the inverse LO signal $\overline{LO}$ 1412 is shifted by 180 degrees with respect to the LO signal LO 1410.

Figure 14B:
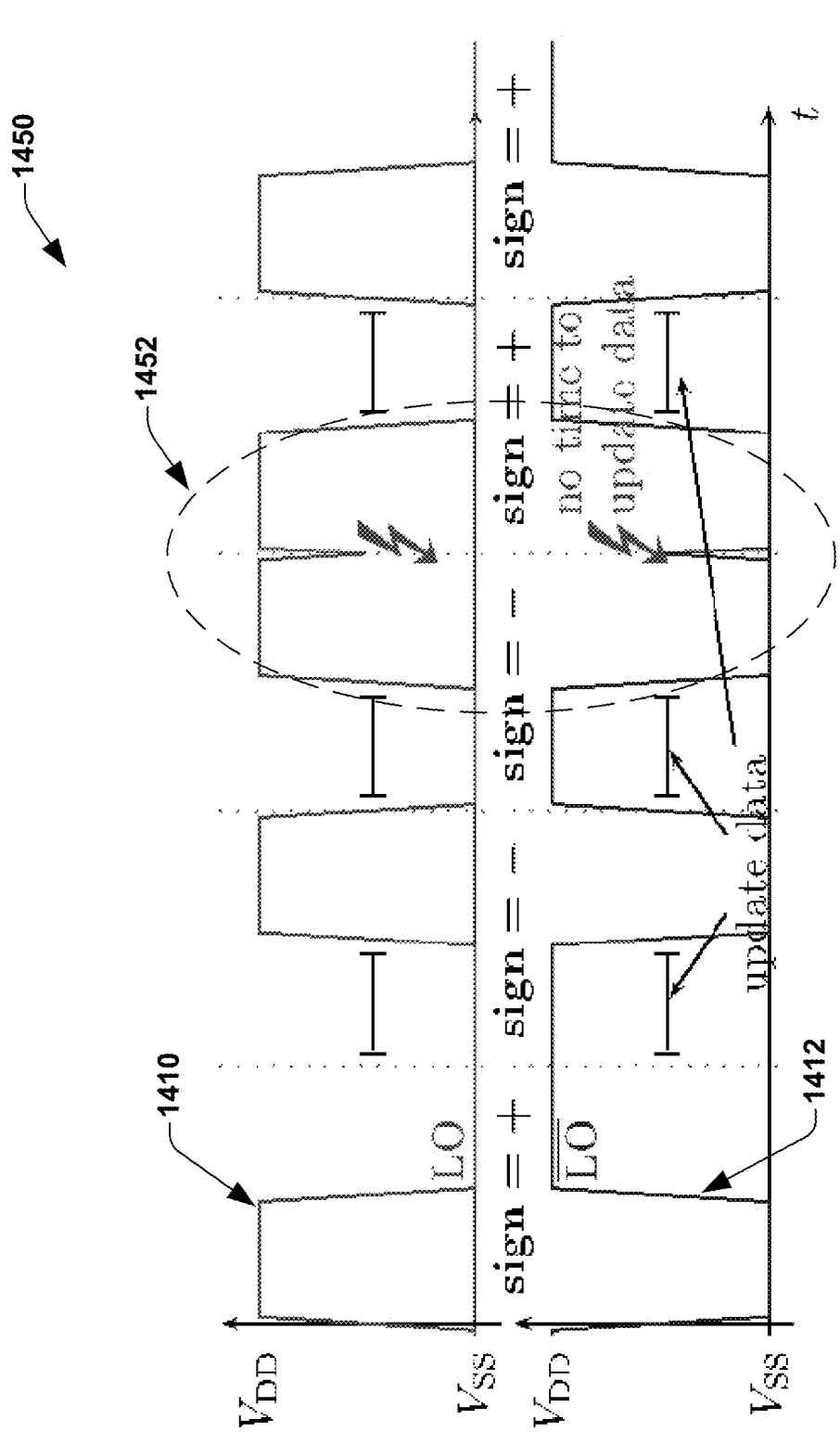
FIG. 14b illustrates a timing diagram associated with an RFDAC array circuit that illustrates touching LO transitions, according to one embodiment of the disclosure.

In some embodiments, the RFDAC array circuit 1400 is configured to receive the LO 1410 and the $\overline{LO}$ 1412 from an LO circuit (e.g., the LO circuit 104 in FIG. 1). In some embodiments, the RFDAC array circuit 1400 is further configured to receive control signals indicative of the input data, from an input decoder circuit (e.g., the input decoder circuit 104 in FIG. 1). In some embodiments, the first half cell circuits and the second half cell circuits associated with a group of differential cells of the array of differential cells of the differential RFDAC array circuit are configured to be activated simultaneously in each LO period, in order to process the input data. In some embodiments, the RFDAC array circuit 1400 is configured to support signed operation. In other words, the RFDAC array circuit 1400 may be configured to process positive input data and negative input data. As indicated above, signed data can be represented in the RF domain by shifting the LO signal by 180°, practically inverting it for the LO periods where the sign of the input data changes. Therefore, in some embodiments, the LO 1410 and the $\overline{LO}$ 1412 are inverted (or swapped) in polarity when the sign of the input data changes as shown in the highlighted portion 1452 of the timing diagram 1450 in FIG. 14*b*. Further, with the sign change, the control signals are updated to reflect the sign change (i.e., to enable/disable cells).

In some embodiments, due to the polarity swapping, the LO signal and the $\overline{LO}$ signal may stay active for a full LO period, referred to herein as a touching LO transition condition, as shown in the timing diagram 1450. The timing diagram 1450 is depicted herein to illustrate a possible touching LO transition condition associated with a sign change that leads to data driven transitions, which is an undesirable behavior, as explained above in previous embodiments. In the timing diagram 1450, the LO signal 1410 and the $\overline{\text{LO}}$ signal 1412 are kept active during the first half of each LO period for positive input data. Further, the LO signal 1410 and the $\overline{\text{LO}}$ signal 1412 are kept active for the second half of each LO period for negative input data. Therefore, in this example embodiment, the touching LO transition is experienced only during negative to positive sign change. However, in other embodiments, the temporal order of activating the LO signal 1410 and the $\overline{\text{LO}}$ signal 1412 may be different. For example, in some embodiments, the LO signal 1410 and the $\overline{\text{LO}}$ signal 1412 may be kept active during the second half of each LO period for positive input data. Further, the LO signal 1410 and the $\overline{\text{LO}}$ signal 1412 may be kept active for the first half of each LO period for negative input data. In such embodiments, the touching LO transition is experienced only during positive to negative sign change.

Figure 14C:
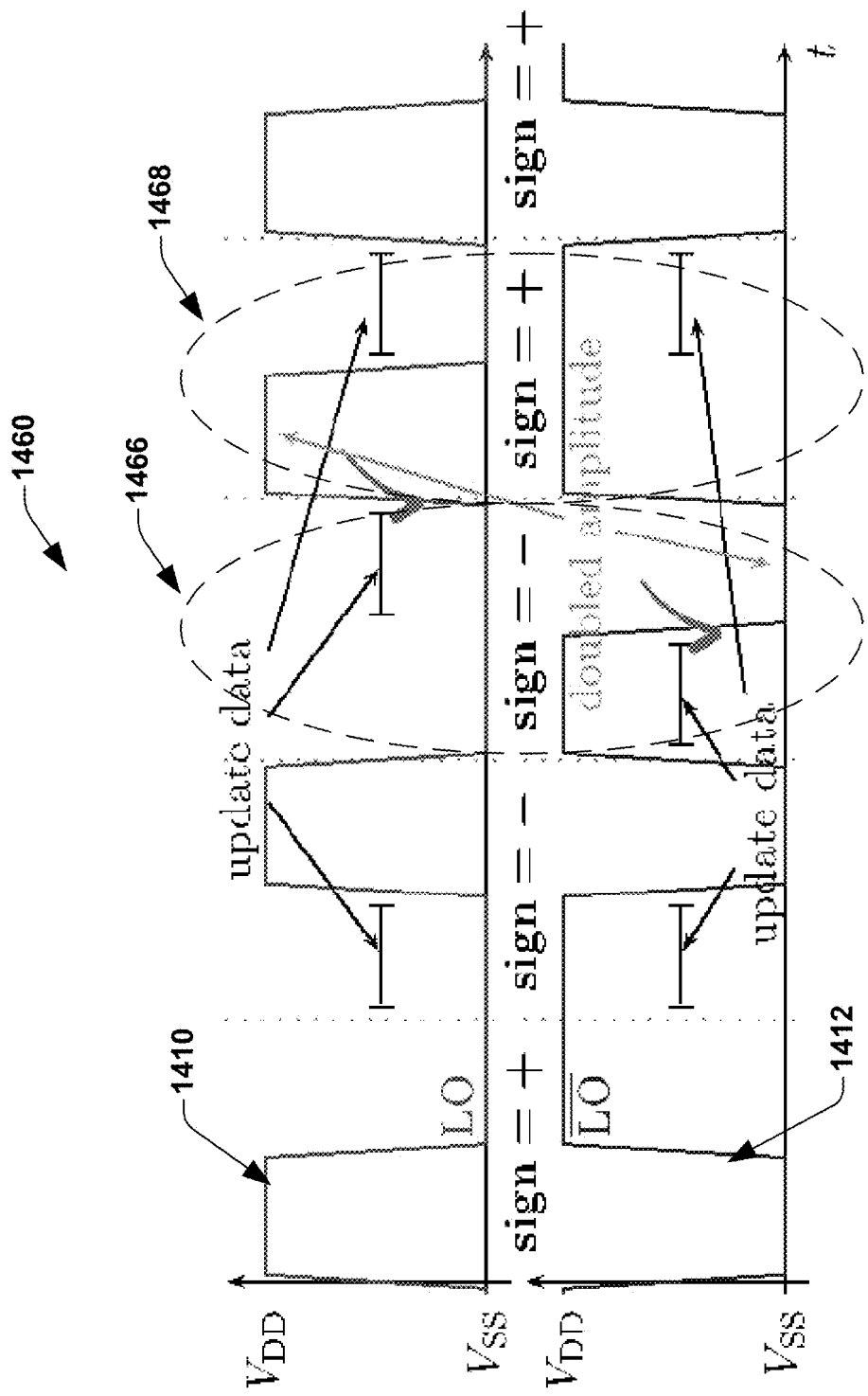
FIGS. 14c-14d illustrates timing diagrams associated with the differential RFDAC array circuit in FIG. 14a, according to one embodiment of the disclosure.

In some embodiments, the RFDAC array circuit 1400 is configured to operate in a way that avoids touching LO transitions during a signal change. In particular, in some embodiments, the RFDAC array circuit 1400 is configured to process an input data based on activating the first half cell circuit and the second half cell circuit associated with a group of differential cells of the array of differential cells, simultaneously in each LO period, during regular operation. In some embodiments, the group of differential cells comprises one or more differential cells of the array of differential cells within the differential RFDAC array circuit. In some embodiments, the RFDAC array circuit 1400 is configured to activate the first half cell circuit and the second half cell circuit associated with the group of differential cells of the array of differential cells, based on the LO signal 1410 and the $\overline{\text{LO}}$ signal 1412, respectively, as shown in FIG. 14c. In particular, as can be seen in FIG. 14c, the LO signal 1410 and the $\overline{\text{LO}}$ signal 1412 are kept active during the first half of each LO period for positive input data. Further, the LO signal 1410 and the $\overline{\text{LO}}$ signal 1412 are kept active for the second half of each LO period for negative input data. Therefore, in this embodiment, for positive input data, the first half cell circuit and the second half cell circuit associated with the group of differential cells of the array of differential cells is activated during the first half of each LO period. Similarly, for negative input data, the first half cell circuit and the second half cell circuit associated with the group of differential cells of the array of differential cells is activated during the second half of each LO period. However, in other embodiments, the temporal order of activating the LO signal 1410 and the $\overline{\text{LO}}$ signal 1412 for positive input data and negative input data may be different, as indicated above. Therefore, in this embodiment, the touching LO transition may be experienced only when the sign change comprises a negative to positive sign change.

In order to avoid the touching LO transitions associated with the sign change, in some embodiments, the RFDAC array circuit 1400 is configured to activate a first set of half cell circuits comprising either a set of first half cell circuits or a set of second half cell circuits in an LO period preceding a sign change associated with the input data, in order to process the input data during a sign change. In other words, only one set of half cell circuits, that is, either the set of first half cell circuits or the set of second half cell circuits is activated in the LO period preceding the sign change, thereby forming the first set of half cell circuits. In some embodiments, the RFDAC array circuit 1400 is further configured to activate a second, different set of half cell circuits comprising either the set of first half cell circuits or the set of second half cell circuits that was not activated during the LO period preceding the sign change, in an LO period succeeding the sign change associated with the input data, in order to process the input data during the sign change. In other words, only one set of half cell circuits, that is, either the set of first half cell circuits or the set of second half cell circuits that was not activated during the LO period preceding the sign change, is activated in the LO period succeeding the sign change, thereby forming the second set of half cell circuits. In some embodiments, the sign change comprises either one of positive to negative sign change or negative to positive sign change, that experiences the touching LO transition condition.

In particular, as can be seen in the highlighted portion 1466 in FIG. 14c, only the $\overline{\text{LO}}$ signal 1412 is kept active during the LO period preceding the sign change (i.e., when the input data is still negative). In this embodiment, the sign change comprises negative to positive sign change. Therefore, in this embodiment, the first set of half cell circuits that is activated in the LO period preceding the sign change comprises the set of second half cell circuits (that is driven by the $\overline{\text{LO}}$ signal 1412). Further, as can be seen in the highlighted portion 1468 in FIG. 14c, only the LO signal 1410 is kept active during the LO period succeeding the sign change (i.e., when the input data is positive). Therefore, in this embodiment, the second set of half cell circuits that is activated in the LO period succeeding the sign change comprises the set of first half cell circuits (that is driven by the LO signal 1410).

Figure 14D:
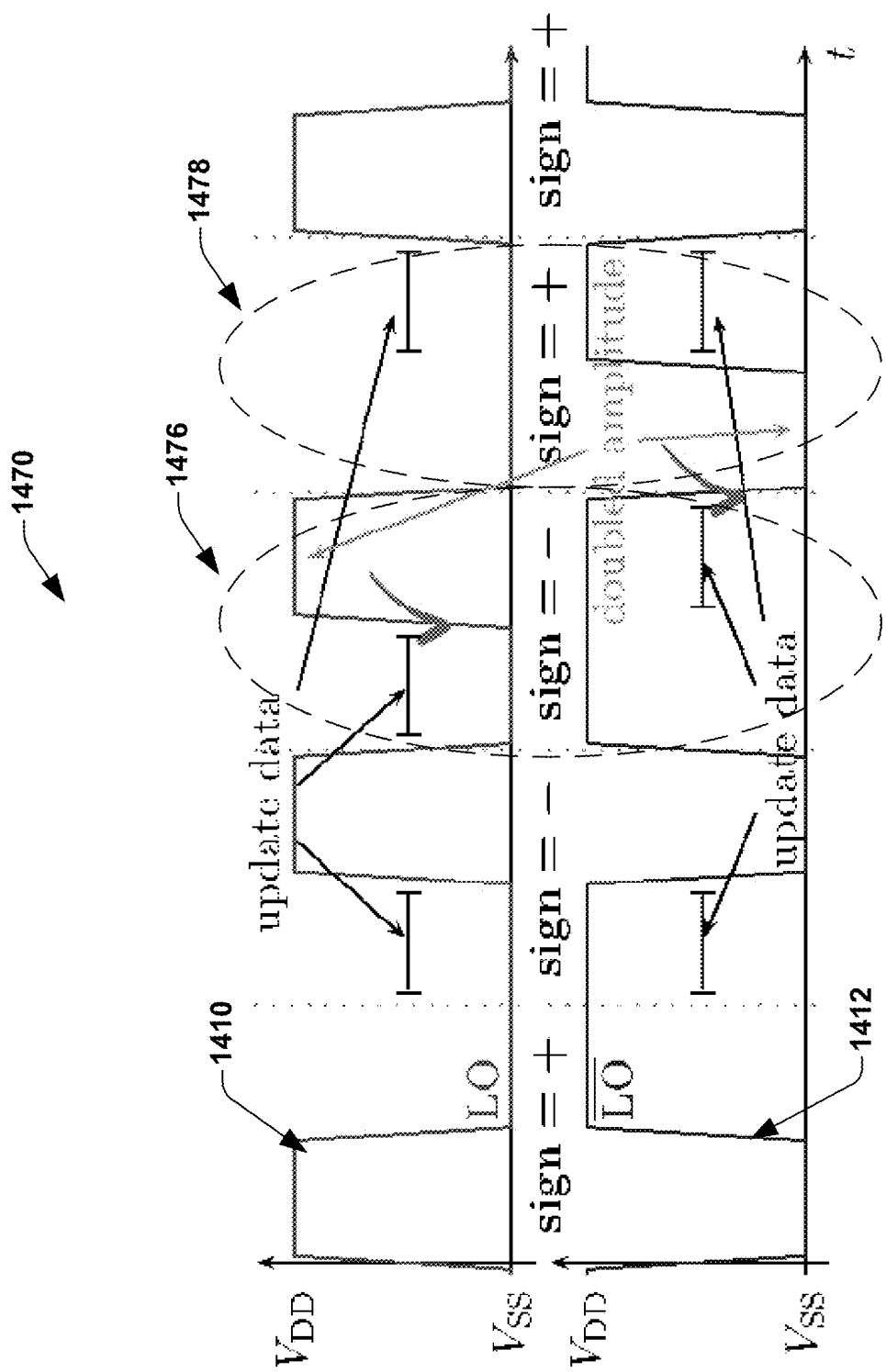

FIG. 14d illustrates another embodiment, where only the LO signal 1410 is kept active during the LO period preceding the sign change (i.e., when the input data is still negative), as can be seen in the highlighted section 1476. Therefore, in this embodiment, the first set of half cell circuits that is activated in the LO period preceding the sign change comprises the set of first half cell circuits (that is driven by the LO signal 1410). Further, as can be seen in the highlighted portion 1478 in FIG. 14d, only the $\overline{\text{LO}}$ signal 1412 is kept active during the LO period succeeding the sign change (i.e., when the input data is positive). Therefore, in this embodiment, the second set of half cell circuits that is activated in the LO period succeeding the sign change comprises the set of second half cell circuits (that is driven by the $\overline{\text{LO}}$ signal 1412).

In some embodiments, a number of half cell circuits in the first set of half cell circuits activated during the LO period preceding the sign change and a number of half cell circuits in the second set of half cell circuits that are activated in the LO period succeeding the sign change is greater than (or double, in some embodiments) a number of differential cells (where both the first half cell circuits and the second half cell circuits are activated simultaneously) in the group of differential cells that are activated during regular operation. In some embodiments, the number of half cell circuits that are activated during the LO period preceding the sign change and during the LO period succeeding the sign change is increased (or doubled), in order to enable the RFDAC array circuit 1400 to handle the same amount of input data during the sign change, compared to the input data that is handled when both sets of half cells circuits are activated during regular operation.

Figure 14E:
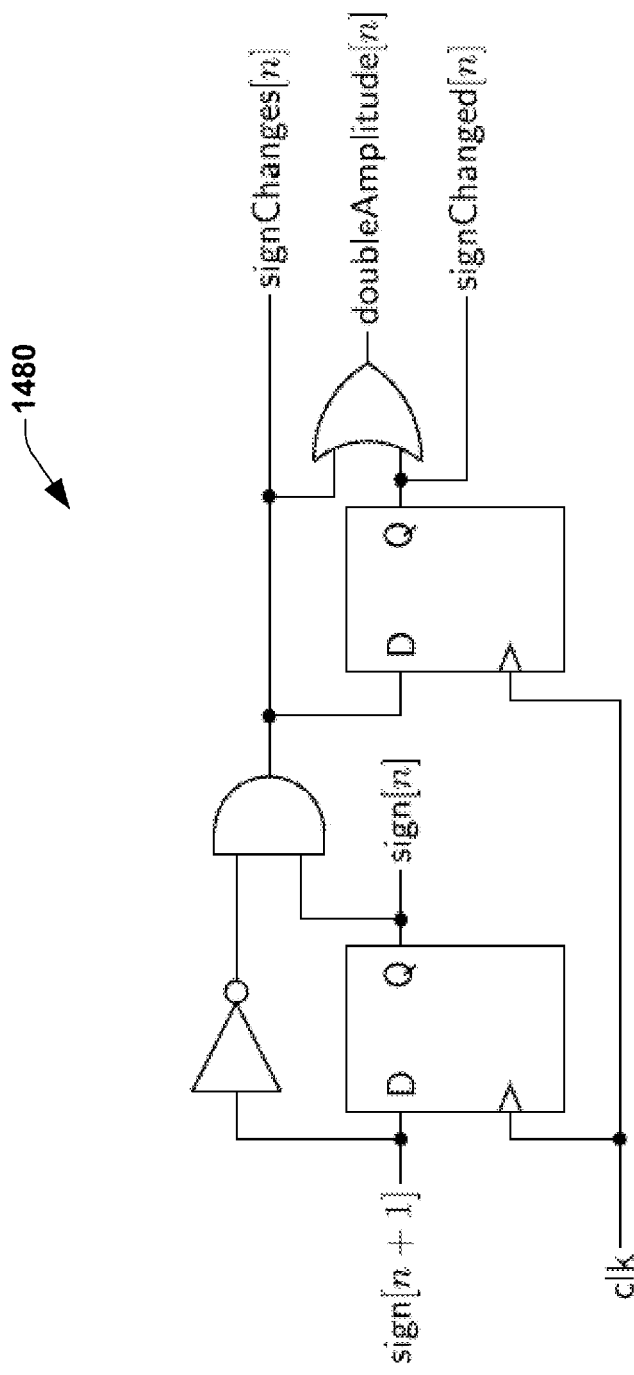
FIG. 14e illustrates one possible implementation of the sign change detector circuit, according to one embodiment of the disclosure.

In some embodiments, the LO circuit and the input decoder circuit are configured to provide updated LO signals and updated control signals, respectively, upon detecting the sign change. In some embodiments, the sign change is detected based on the outputs from a sign change detector circuit (which may or may not be part of the differential RFDAC circuit. FIG. 14e illustrates one possible implementation of the sign change detector circuit 1480, according to one embodiment of the disclosure. In some embodiments, the sign change detector circuit 1480 generates three outputs signChanges[n], signChanged[n] and doubleAmplitude[n]. In some embodiments, the signal signChanges[n] indicates that the sign changes in the next period, while signChanged[n] indicates that the sign changed in the previous period. Finally, the signal doubleAmplitude[n] is active when either of the two signals is high and determines whether the amplitude information needs to be doubled.

Figure 14F:
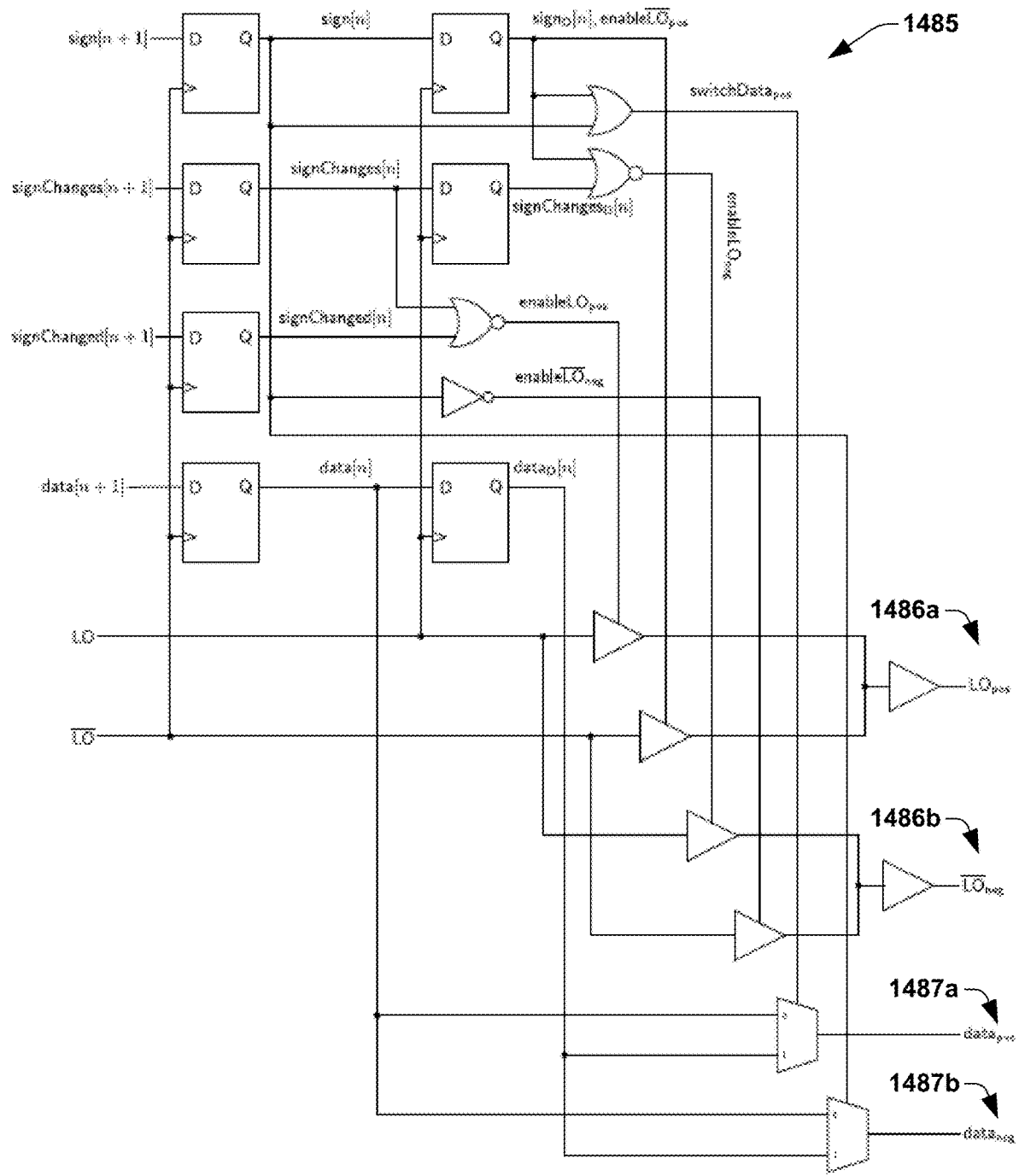
FIG. 14f illustrates a possible implementation of a decoder circuit, according to one embodiment of the disclosure.
Figure 14G:
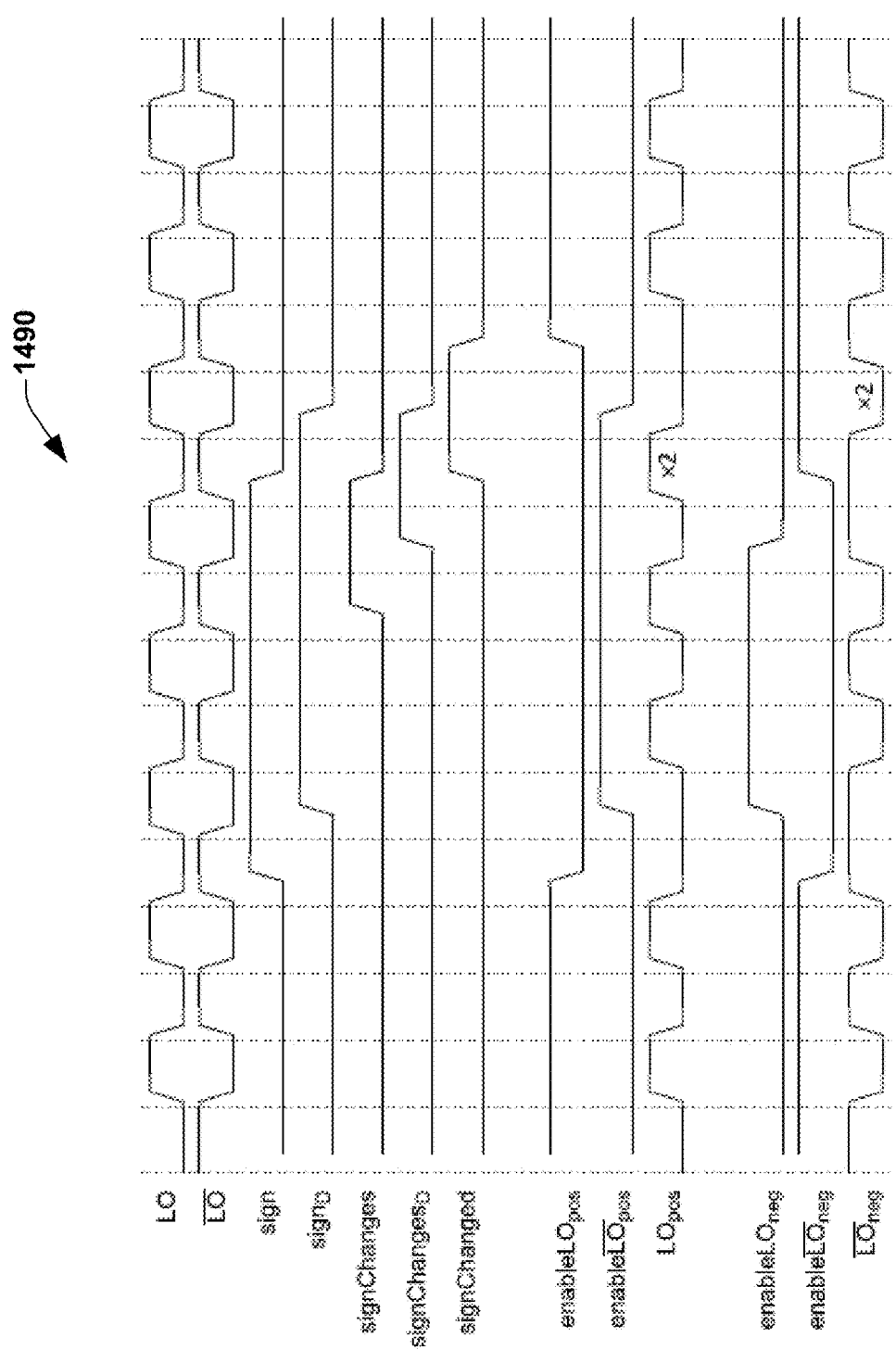
FIG. 14g illustrates a timing diagram for the generation of the updated LO signals based on the decoder circuit in FIG. 14f.
Figure 14H:
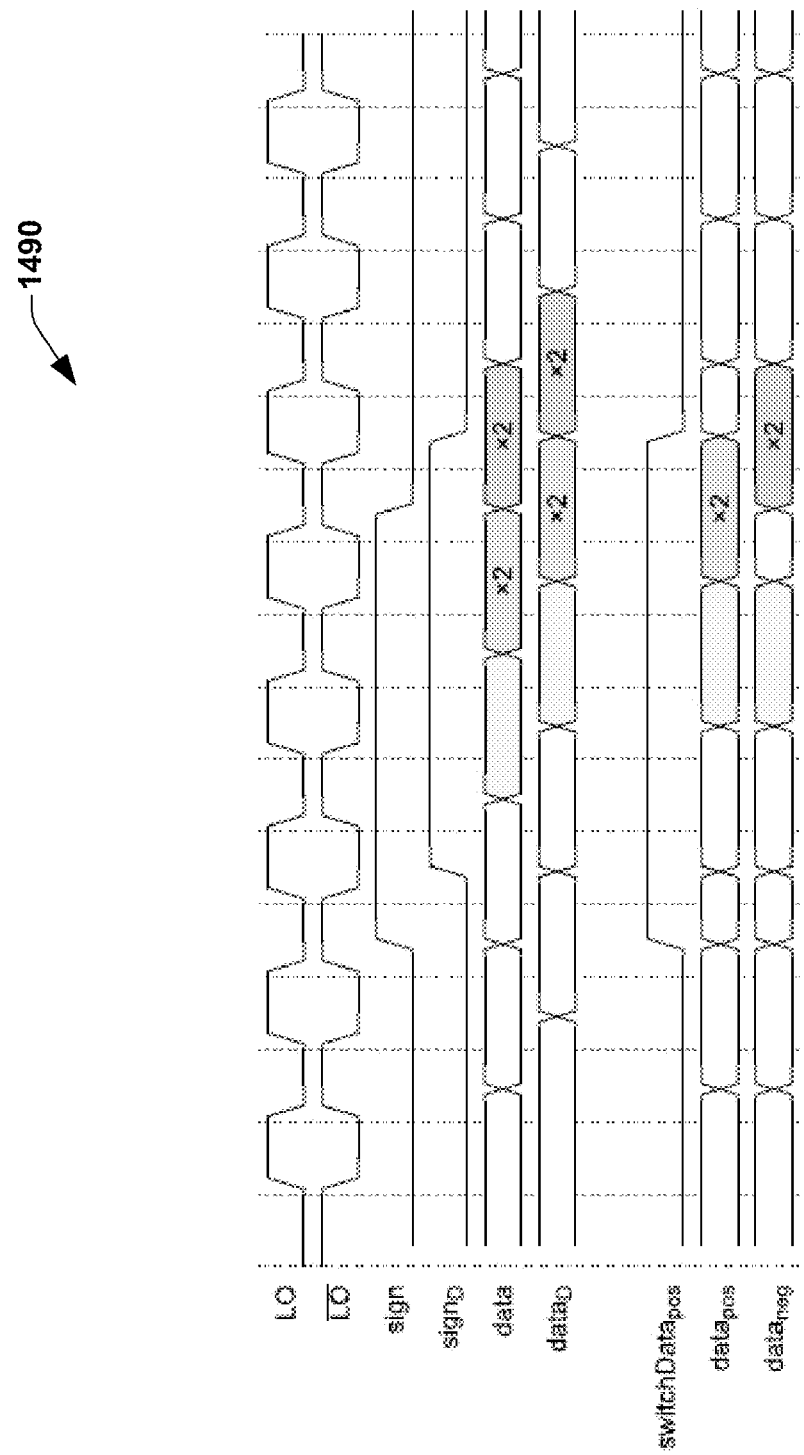
FIG. 14h illustrates a timing diagram for the generation of the updated control signals based on the decoder circuit in FIG. 14f.

FIG. 14f illustrates a possible implementation of a decoder circuit 1485, according to one embodiment of the disclosure. In some embodiments, the decoder circuit 1485 is configured to generate the updated LO signals (i.e., 1486a and 1486b) and the updated control signals (i.e., 1487a and 1487b) to the RFDAC array circuit 1400 in FIG. 14a. In some embodiments, the decoder circuit 1485 is configured to generate the updated LO signals and the updated control signals based on the signals from a sign change detector circuit (e.g., the sign change detector circuit 1480 in FIG. 14e above). In some embodiments, the updated LO signals and the updated control signals are generated in advance to the sign change, based on the output from the sign change detector circuit. In some embodiments, the decoder circuit 1485 is a combined implementation the LO circuit and the input decoder circuit, described in the embodiments above. In different embodiments, the LO circuit and the input decoder circuit may be implemented in a combined manner or as separate circuits. FIG. 14g illustrates a timing diagram 1490 for the generation of the updated LO signals based on the decoder circuit 1485 in FIG. 14f. Further, FIG. 14h illustrates a timing diagram 1495 for the generation of the updated control signals based on the decoder circuit 1485 in FIG. 14f.

Figure 15:
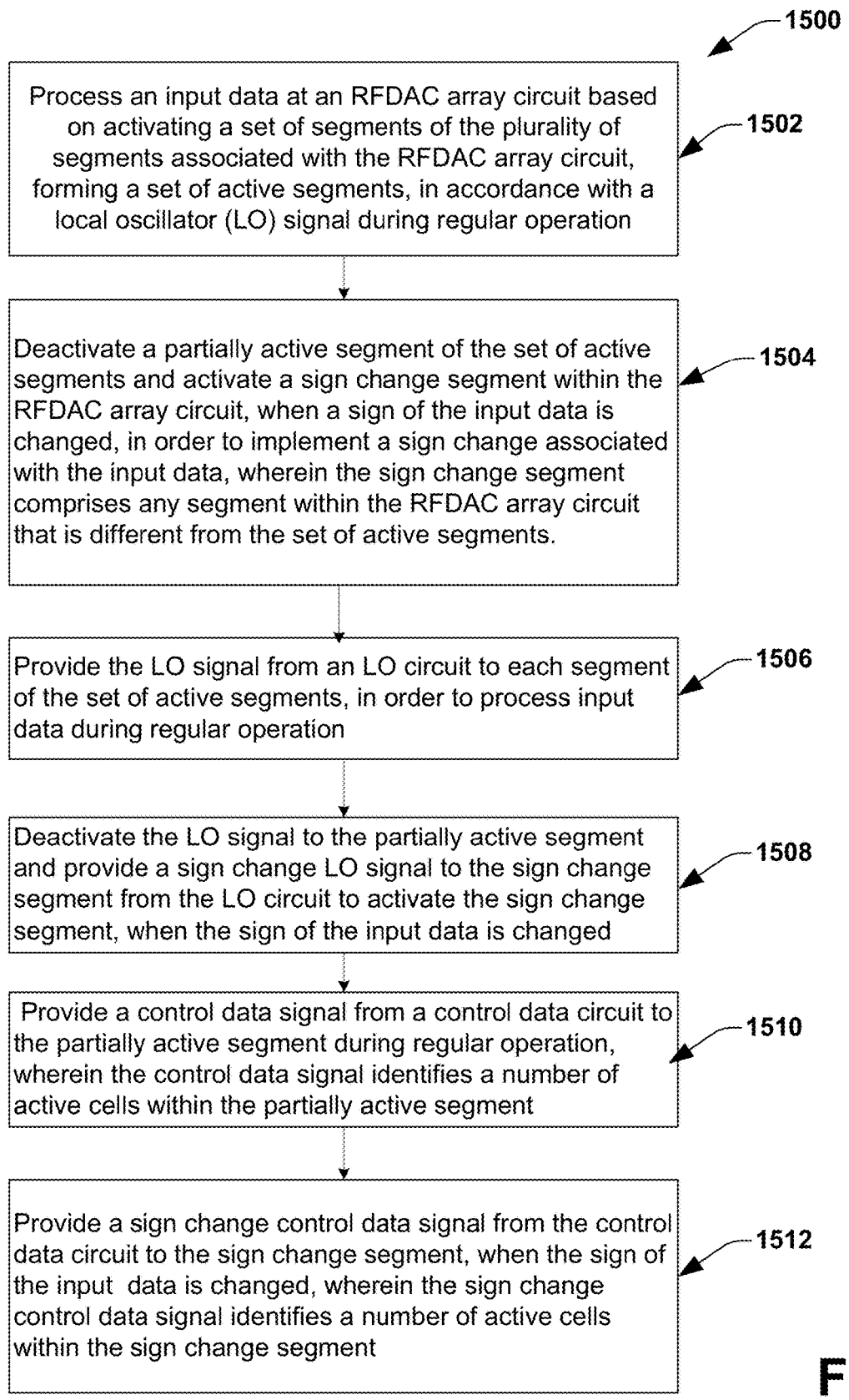
FIG. 15 illustrates a flow chart of a method for a radio frequency digital-to-analog converter (RFDAC) circuit, according to one embodiment of the disclosure.

FIG. 15 illustrates a flow chart of a method 1500 for a radio frequency digital-to-analog converter (RFDAC) circuit, according to one embodiment of the disclosure. In some embodiments, the method 1500 is explained herein with reference to the RFDAC array circuit 500 in FIGS. 5a-5d and the timing diagram 600 in FIG. 6. In some embodiments, the RFDAC array circuit 500 may be included within the RFDAC array circuit 202 in FIG. 2 and the RFDAC array circuit 102 in FIG. 1. Therefore, in some embodiments, the method 1500 is further explained herein with reference to the RFDAC circuit 100 in FIG. 1 and the RFDAC circuit 200 in FIG. 2. At 1502, an input data is processed at an RFDAC array circuit (e.g., the RFDAC array circuit 500 in FIG. 5a and FIG. 5b) based on activating a set of segments of the plurality of segments associated with the RFDAC array circuit, forming a set of active segments (e.g., the segments 502a, 502b and 502c in FIG. 5a and FIG. 5b), in accordance with a local oscillator (LO) signal (e.g., the LO signals 204a, 204b etc. in FIG. 2) during regular operation.

At 1504, a partially active segment (e.g., the partially active segment 502c in FIG. 5c) of the set of active segments is deactivated and a sign change segment (e.g., the sign change segment 502d in FIG. 5c) within the RFDAC array circuit is activated, when a sign of the input data is changed (e.g., sign change from positive to negative as shown in FIG. 5c), in order to implement the sign change associated with the input data. In some embodiments, the sign change segment comprises any segment within the RFDAC array circuit that is different from the set of active segments. In some embodiments, the partially active segment is deactivated and the sign change segment is activated, only for a predefined time interval following the sign change of the input data (e.g., for a first half of the LO period following the sign change), as explained above with respect to FIGS. 5a-5d. At 1506, the LO signal is provided from an LO circuit (e.g., the LO circuit 104 in FIG. 1) to each segment of the set of active segments, in order to process input data during regular operation. At 1508, the LO signal (e.g., the LO right signal 606 in FIG. 6) to the partially active segment is deactivated and a sign change LO signal (e.g., the sign change LO right signal 610 in FIG. 6) is provided to the sign change segment from the LO circuit to activate the sign change segment, when the sign of the input data is changed.

At 1510, a control data signal (e.g., the control data signals 208a, 208b etc. in FIG. 2) from a control data circuit (e.g., the control data circuit 212 in FIG. 2) is provided to the partially active segment during regular operation. In some embodiments, the control data signal identifies a number of active cells within the partially active segment. At 1512, a sign change control data signal (e.g., the sign change control right signal 614 in FIG. 6) is provided from the control data circuit to the sign change segment, when the sign of the input data is changed. In some embodiments, the sign change control data signal identifies a number of active cells within the sign change segment. In some embodiments, the sign change segment is deactivated after the predefined time interval after the sign change. Further, in some embodiments, the partially active segment is selectively reactivated after the predefined time interval after the sign change, based on the input data change, as explained above with respect to FIG. 5d. In such embodiments, the LO circuit may be configured to deactivate the sign change LO signal and activate the LO signal to the partially active segment after the predefined time interval after the sign change. In some embodiments, the LO signal after the sign change comprises an updated LO signal having an inverted polarity relative to the LO signal before the sign change. Further, the input decoder circuit is configured to deactivate the sign change control data signal to the sign change segment after the predefined time interval.

Figure 16:
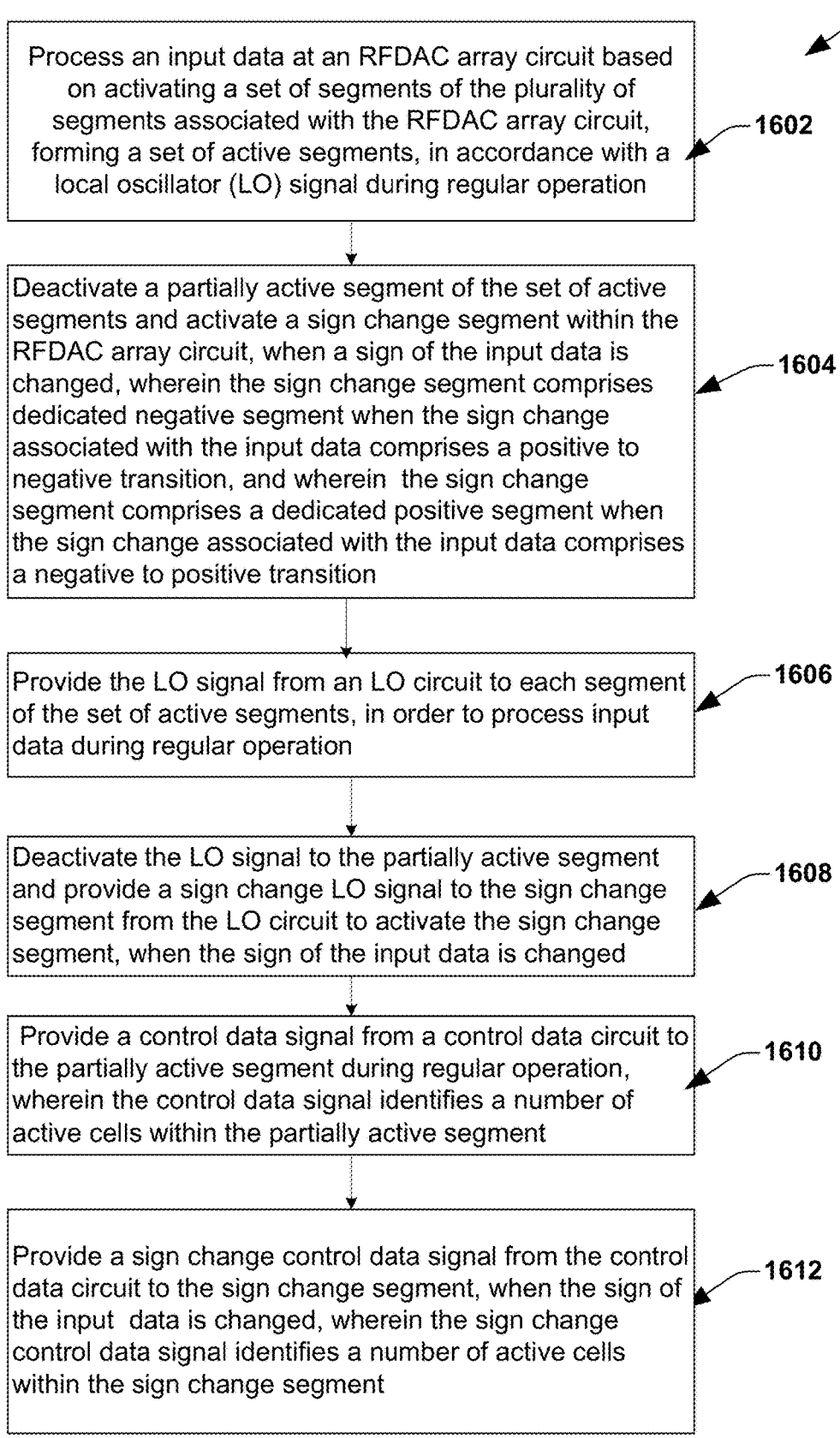
FIG. 16 illustrates a flow chart of a method for a radio frequency digital-to-analog converter (RFDAC) circuit, according to another embodiment of the disclosure.

FIG. 16 illustrates a flow chart of a method 1600 for a radio frequency digital-to-analog converter (RFDAC) circuit, according to one embodiment of the disclosure. In some embodiments, the method 1600 is explained herein with reference to the RFDAC array circuit 1200 in FIGS. 12a-12c. In some embodiments, the RFDAC array circuit 1200 may be included within the RFDAC array circuit 202 in FIG. 2 and the RFDAC array circuit 102 in FIG. 1. Therefore, in some embodiments, the method 1600 is further explained herein with reference to the RFDAC circuit 100 in FIG. 1 and the RFDAC circuit 200 in FIG. 2. At 1602, an input data is processed at an RFDAC array circuit (e.g., the RFDAC array circuit 1200 in FIGS. 12a-12c) based on activating a set of segments of the plurality of segments associated with the RFDAC array circuit, forming a set of active segments (e.g., the segments 1203 in FIG. 12a), in accordance with a local oscillator (LO) signal (e.g., the LO signals 204a, 204b etc. in FIG. 2) during regular operation.

At 1604, a partially active segment (e.g., the partially active segment 1203a in FIG. 12a) of the set of active segments is deactivated and a sign change segment (e.g., the sign change segment 1202 in FIG. 12b or the sign change segment 1204 in FIG. 12c) within the RFDAC array circuit is activated, when a sign of the input data is changed, in order to implement the sign change associated with the input data. In some embodiments, the sign change segment comprises a dedicated negative segment (e.g., the dedicated negative segment 1202 in FIG. 12b) when the sign change associated with the input data comprises a positive to negative transition. In other embodiments, the sign change segment comprises a dedicated positive segment (e.g., the dedicated positive segment 1204 in FIG. 12*c*) when the sign change associated with the input data comprises a negative to positive transition. In some embodiments, the partially active segment is deactivated and the sign change segment is activated, only for a predefined time interval following the sign change of the input data (e.g., for a first half of the LO period following the sign change).

At 1606, the LO signal is provided from an LO circuit (e.g., the LO circuit 104 in FIG. 1) to each segment of the set of active segments, in order to process input data during regular operation. At 1608, the LO signal to the partially active segment is deactivated and a sign change LO signal is provided to the sign change segment from the LO circuit to activate the sign change segment, when the sign of the input data is changed. At 1610, a control data signal (e.g., the control data signals 208*a*, 208*b* etc. in FIG. 2) from a control data circuit (e.g., the control data circuit 212 in FIG. 2) is provided to the partially active segment during regular operation. In some embodiments, the control data signal identifies a number of active cells within the partially active segment. At 1612, a sign change control data signal is provided from the control data circuit to the sign change segment, when the sign of the input data is changed. In some embodiments, the sign change control data signal identifies a number of active cells within the sign change segment. In some embodiments, the sign change segment is deactivated after the predefined time interval after the sign change. Further, in some embodiments, the partially active segment is selectively reactivated after the predefined time interval after the sign change, depending on the input data change, as explained above with respect to FIGS. 12*a*-12*c* above. In such embodiments, the LO circuit may be configured to deactivate the sign change LO signal and activate the LO signal to the partially active segment after the predefined time interval after the sign change. In some embodiments, the LO signal after the sign change comprises an updated LO signal having an inverted polarity relative to the LO signal before the sign change. Further, the input decoder circuit is configured to deactivate the sign change control data signal to the sign change segment after the predefined time interval.

Figure 17:
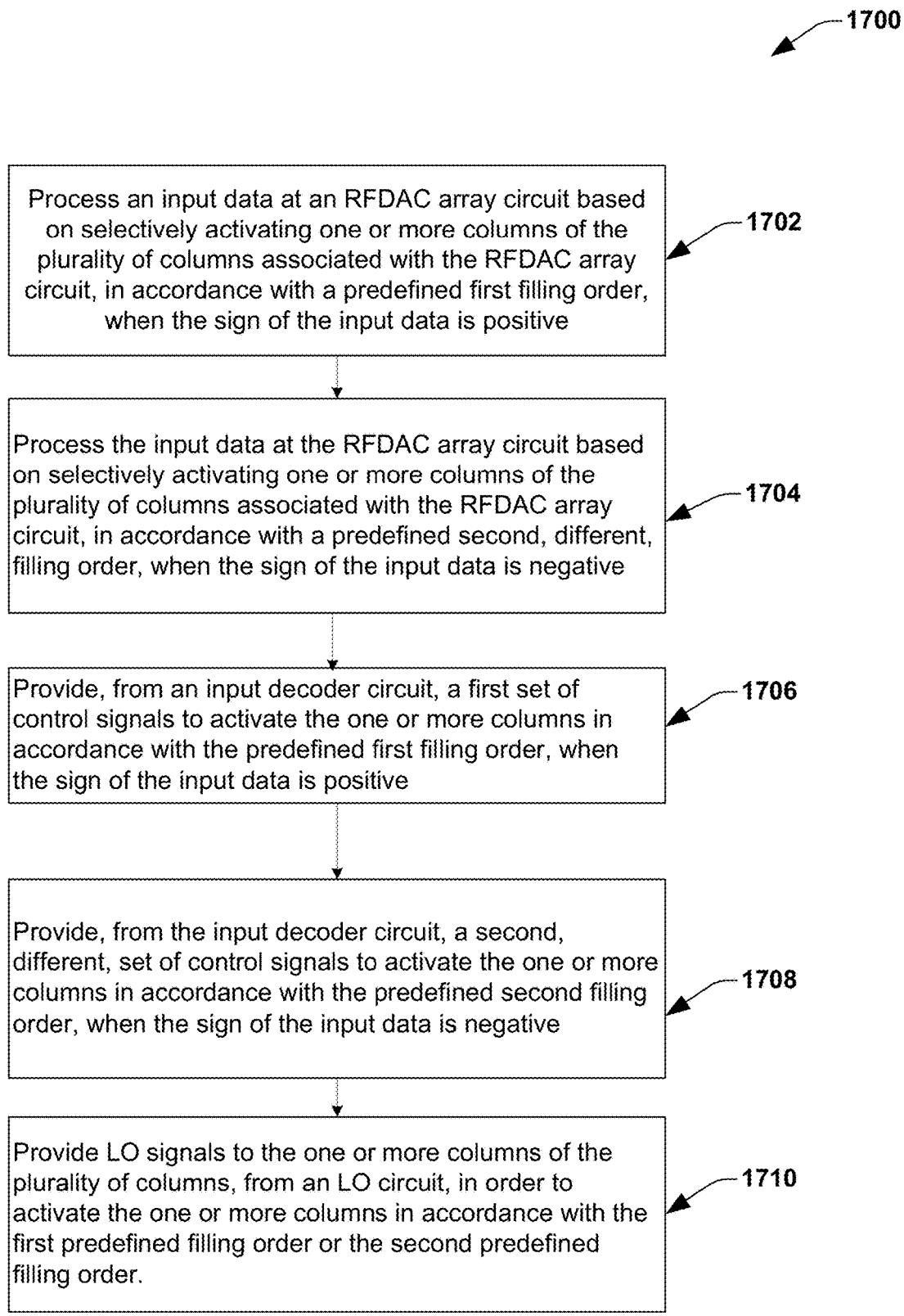
FIG. 17 illustrates a flow chart of a method for a radio frequency digital-to-analog converter (RFDAC) circuit, according to yet another embodiment of the disclosure.

FIG. 17 illustrates a flow chart of a method 1700 for a radio frequency digital-to-analog converter (RFDAC) circuit, according to one embodiment of the disclosure. In this embodiment, the method 1700 is explained with reference to the RFDAC array circuit 1300 in FIG. 13*a* and the filling order tables 1320 and 1350 in FIG. 13*b* and FIG. 13*c*, respectively. In some embodiments, the RFDAC array circuit 1300 may be included within the RFDAC array circuit 202 in FIG. 2 and the RFDAC array circuit 102 in FIG. 1. Therefore, the method 1700 is further explained herein with reference to the RFDAC circuit 100 in FIG. 1 and the RFDAC circuit 200 in FIG. 2. At 1702, an input data is processed at an RFDAC array circuit (e.g., the RFDAC array circuit 1300 in FIG. 13*a*) based on selectively activating one or more columns of the plurality of columns associated with the RFDAC array circuit, in accordance with a predefined first filling order (e.g., Col0→Col1→Col2→Col3 as shown in the filling order table 1320 in FIG. 13*b*), when the sign of the input data is positive.

At 1704, the input data is processed at the RFDAC array circuit based on selectively activating one or more columns of the plurality of columns associated with the RFDAC array circuit, in accordance with a predefined second, different, filling order (e.g., Col1→Col0→Col2→Col3 as shown in the filling order table 1320 in FIG. 13*b*), when the sign of the input data is positive. In some embodiments, the filling order comprises an order in which the one or more columns of the plurality of columns are activated, in order to process the input data. At 1706, a first set of control signals (e.g., the segment control signals or control data signals or both explained above with respect to FIG. 2) is provided from an input decoder circuit (e.g., the input decoder circuit 106 in FIG. 1) to the RFDAC array circuit to activate the one or more columns in accordance with the predefined first filling order, when the sign of the input data is positive. At 1708, a second, different, set of control signals is provided from the input decoder circuit to the RFDAC array circuit, to activate the one or more columns in accordance with the predefined second filling order, when the sign of the input data is negative. At 1710, LO signals to the one or more columns of the plurality of columns, is provided from an LO circuit (e.g., the LO circuit 104 in FIG. 1), in order to activate the one or more columns in accordance with the first predefined filling order or the second predefined filling order.

Figure 18:
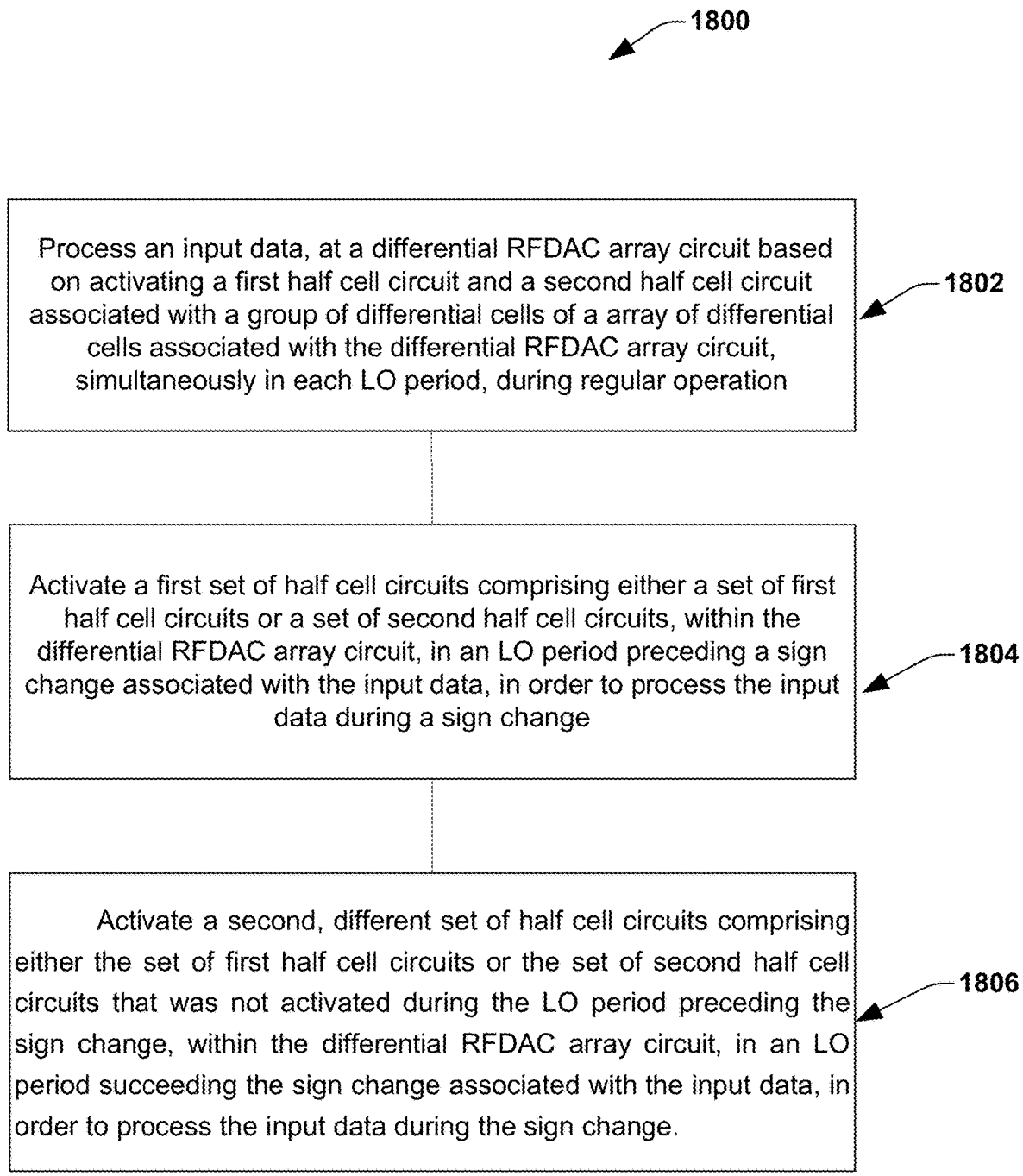
FIG. 18 illustrates a flow chart of a method for a differential radio frequency digital-to-analog converter (RFDAC) circuit, according to one embodiment of the disclosure.

FIG. 18 illustrates a flow chart of a method 1800 for a differential radio frequency digital-to-analog converter (RFDAC) circuit, according to one embodiment of the disclosure. In this embodiment, the method 1800 is explained with reference to the differential RFDAC array circuit 1400 in FIG. 14*a* and the timing diagrams 1460 and 1470 in FIG. 14*c* and FIG. 14*d*, respectively. In some embodiments, the RFDAC array circuit 1400 may be included within the RFDAC array circuit 102 in FIG. 1. Therefore, the method 1800 is further explained herein with reference to the RFDAC circuit 100 in FIG. 1. At 1802, an input data is processed at a differential RFDAC array circuit (e.g., the differential RFDAC array circuit 1400 in FIG. 14*a*) based on activating a first half cell circuit (e.g., the first half cell circuit 1402*a* in FIG. 14*a*) and a second half cell circuit (e.g., the second half cell circuit 1402*b* in FIG. 14*a*) associated with a group of differential cells of an array of differential cells associated with the differential RFDAC array circuit, simultaneously in each LO period, during regular operation. In some embodiments, the group of differential cells comprises one or more differential cells of the array of differential cells within the differential RFDAC array circuit. In some embodiments, the first half cell circuit and the second half cell circuit are driven by a local oscillator (LO) signal and an inverse LO signal respectively.

At 1804, a first set of half cell circuits comprising either a set of first half cell circuits or a set of second half cell circuits, within the differential RFDAC array circuit, is activated in an LO period preceding a sign change associated with the input data (e.g., in the LO period as shown in the highlighted portion 1466 in FIG. 14*c*), in order to process the input data during a sign change. At 1806, a second, different set of half cell circuits comprising either the set of first half cell circuits or the set of second half cell circuits that was not activated during the LO period preceding the sign change, is activated in an LO period succeeding the sign change associated with the input data (e.g., in the LO period as shown in the highlighted portion 1468 in FIG. 14*c*), in order to process the input data during the sign change. In some embodiments, the sign change comprises one of a negative to positive sign change or a positive to negative sign change, depending on a temporal order of activating the LO signal and the LO signal, as explained above with respect to FIGS. 14*a*-14*d*.

In some embodiments, a number of half cell circuits in the first set of half cell circuits activated during the LO period preceding the sign change and a number of half cell circuits in the second set of half cell circuits that are activated in the LO period succeeding the sign change is greater than (or double, in some embodiments) a number of differential cells (where both the first half cell circuits and the second half cell circuits are activated simultaneously) in the group of differential cells that are activated during regular operation. In some embodiments, the number of half cell circuits that are activated during the LO period preceding the sign change and during the LO period succeeding the sign change is increased (or doubled), in order to enable the RFDAC array circuit to handle the same amount of input data during the sign change, compared to the input data that is handled when both sets of half cells circuits are activated during regular operation.

While the methods are illustrated and described above as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the disclosure herein. Also, one or more of the acts depicted herein may be carried out in one or more separate acts and/or phases.

While the apparatus has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application.

Examples can include subject matter such as a method, means for performing acts or blocks of the method, at least one machine-readable medium including instructions that, when performed by a machine cause the machine to perform acts of the method or of an apparatus or system for concurrent communication using multiple communication technologies according to embodiments and examples described herein.

Example 1 is a radio frequency digital-to-analog converter (RFDAC) circuit comprising an RFDAC array circuit comprising an array of cells arranged into a plurality of segments, each segment comprising a set of cells, wherein each segment of the plurality of segments is configured to process input data signals; and wherein the RFDAC array circuit is configured to process an input data based on activating a set of segments of the plurality of segments, forming a set of active segments, in accordance with a local oscillator (LO) signal, during regular operation; and when the sign of the input data is changed, deactivate a partially active segment of the set of active segments and activate a sign change segment within the RFDAC array circuit, in order to implement the sign change associated with the input data; wherein the sign change segment comprises a segment within the plurality of segments of the RFDAC array circuit that is different from the set of active segments.

Example 2 is an RFDAC circuit, including the subject matter of example 1, further comprising an LO circuit configured to provide the LO signal to each segment of the set of active segments, in order to process input data during regular operation, and when the sign change of the input data occurs, deactivate the LO signal to the partially active segment and provide a sign change LO signal to the sign change segment to activate the sign change segment, in order to implement the sign change associated with the input data, wherein the sign change LO signal has inverted polarity relative to the LO signal or the sign change LO is shifted by 180 degrees, with respect to the LO signal.

Example 3 is an RFDAC circuit, including the subject matter of examples 1-2, including or omitting elements, further comprising an input decoder circuit configured to provide a control data signal to the partially active segment, wherein the control data signal identifies a number of active cells within the partially active segment during regular operation; and when the sign change of the input data occurs, provide a sign change control data signal to the sign change segment, wherein the sign change control data signal reflects the control data signal to be provided to the partially active segment after the sign change, and wherein the sign change control data signal identifies a number of active cells within the sign change segment.

Example 4 is an RFDAC circuit, including the subject matter of examples 1-3, including or omitting elements, wherein the sign change segment comprises any segment within the RFDAC array circuit that is different from the set of active segments.

Example 5 is an RFDAC circuit, including the subject matter of examples 1-4, including or omitting elements, wherein the partially active segment comprises one or more partially active segments and the sign change segment comprises one or more sign change segments.

Example 6 is an RFDAC circuit, including the subject matter of examples 1-5, including or omitting elements, wherein the sign change segment comprises one of a dedicated negative segment and a dedicated positive segment, wherein the dedicated negative segment comprises a segment within the RFDAC array circuit configured to process only negative input data signals and wherein the dedicated negative segment comprises the sign change segment when the sign change associated with the input data comprises a positive to negative transition; and wherein the dedicated positive segment comprises a segment within the RFDAC array circuit configured to process only positive input data signals and wherein the dedicated positive segment comprises the sign change segment when the sign change associated with the input data comprises a negative to positive transition.

Example 7 is an RFDAC circuit, including the subject matter of examples 1-6, including or omitting elements, wherein the RFDAC array circuit is configured to deactivate the partially active segment of the set of active segments and activate the sign change segment within the RFDAC array circuit, only for a predefined time interval following the sign change of the input data.

Example 8 is an RFDAC circuit, including the subject matter of examples 1-7, including or omitting elements, wherein the RFDAC array circuit is further configured to deactivate the sign change segment, after the predefined time interval.

Example 9 is an RFDAC circuit, including the subject matter of examples 1-8, including or omitting elements, wherein the predefined time interval comprises half an LO period after the sign change.

Example 10 is an RFDAC circuit, including the subject matter of examples 1-9, including or omitting elements, when each cell of the RFDAC array circuit comprises a left half circuit and a right half circuit, wherein the left half cell circuit and the right half cell circuit are driven with opposite phases of the LO signal or with LO signal phase shifted by 180 degrees.

Example 11 is an RFDAC circuit, including the subject matter of examples 1-10, including or omitting elements, wherein selectively deactivating the partially active segment comprises deactivating either the right half circuits or the left half circuits associated with the partially active segment that would experience a touching LO transition associated with the sign change, and activating the sign change segment comprises activating either the right half circuits or the left half circuits corresponding to the partially active segment.

Example 12 is an RFDAC circuit, including the subject matter of examples 1-11, including or omitting elements, wherein the number of active cells within the partially active segment and the number of active cells within the sign change segment is different.

Example 13 is an RFDAC circuit, including the subject matter of examples 1-12, including or omitting elements, wherein the input data comprises I-phase input data and Q-phase input data, and wherein processing the input data comprises processing the I-phase input data based on activating a set of segments of the plurality of segments of the RFDAC array circuit, forming a set of I-phase segments, in accordance with the local oscillator (LO) signal; and processing the Q-phase input data based on activating a set of segments of the plurality of segments of the RFDAC array circuit, forming a set of Q-phase segments, in accordance with the local oscillator (LO) signal.

Example 14 is an RFDAC circuit, including the subject matter of examples 1-13, including or omitting elements, wherein implementing the sign change comprises deactivating a partially active segment within the set of I-phase segments and a I-phase sign change segment within the RFDAC array circuit, in order to implement a sign change associated with the I-phase input data, wherein the I-phase sign change segment comprises a segment within the plurality of segments within the RFDAC array circuit that is different from the set of I-phase segments and the set of Q-phase segments; and deactivating a partially active segment within the set of Q-phase segments and activating a Q-phase sign change segment within the RFDAC array circuit, in order to implement a sign change associated with the Q-phase input data, wherein the Q-phase sign change segment comprises a segment within the plurality of segments within the RFDAC array circuit that is different from the set of Q-phase segments and the set of I-phase segments.

Example 15 is an RFDAC circuit, including the subject matter of examples 1-14, including or omitting elements, wherein the control data signal provided by the input decoder circuit comprises an I-phase control data signal that identifies a number of active cells within the partially active segment of the set of active I-phase segments, and a Q-phase control data signal that identifies a number of active cells within the partially active segment of the set of active Q-phase segments.

Example 16 is an RFDAC circuit, including the subject matter of examples 1-15, including or omitting elements, wherein the sign change control data signal provided by the input decoder circuit comprises an I-phase sign change control data signal that identifies a number of active cells within the I-phase sign change segment, and a Q-phase sign change control data signal that identifies a number of active cells within the Q-phase sign change segment.

Example 17 is a radio frequency digital-to-analog converter (RFDAC) circuit comprising an RFDAC array circuit comprising an array of cells arranged into a plurality of columns, each column comprising a set of cells, wherein each column of the plurality of columns is configured to process input data signals, and wherein the RFDAC array circuit is configured to process an input data based on activating one or more columns of the plurality of columns, in accordance with a predefined first filling order, when the sign of the input data is positive; and process the input data based on activating one or more columns of the plurality of columns, in accordance with a predefined second, different, filling order, when the sign of the input data is negative; wherein the filling order comprises a predefined order in which the plurality of columns is configured to be activated, in order to process the input data.

Example 18 is an RFDAC circuit, including the subject matter of example 17, wherein the predefined first filling order and the predefined second filling order differ by one or more columns.

Example 19 is an RFDAC circuit, including the subject matter of examples 17-18, including or omitting elements, wherein the predefined first filling order and the predefined second filling order differ by one column, when the code variation associated with the sign change of the input data is less than one column.

Example 20 is an RFDAC circuit, including the subject matter of examples 17-19, including or omitting elements, further comprising an input decoder circuit configured to provide a first set of control signals to activate the one or more columns in accordance with the predefined first filling order, when the sign of the input data is positive; and provide a second, different, set of control signals to activate the one or more columns in accordance with the predefined second filling order, when the sign of the input data is negative.

Example 21 is a differential radio frequency digital-to-analog converter (RFDAC) circuit comprising a differential RFDAC array circuit comprising an array of differential cells, each differential cell comprising a first half cell circuit and a second half cell circuit, wherein the first half cell circuit and the second half cell circuit are driven by a local oscillator (LO) signal and an inverse LO signal respectively, and wherein the differential RFDAC array circuit is configured to process an input data based on activating the first half cell circuit and the second half cell circuit associated with a group of differential cells of the array of differential cells, simultaneously in each LO period, during regular operation; activate a first set of half cell circuits comprising either a set of first half cell circuits or a set of second half cell circuits in an LO period preceding a sign change associated with the input data, in order to process the input data during a sign change; and activate a second, different set of half cell circuits comprising either the set of first half cell circuits or the set of second half cell circuits that was not activated during the LO period preceding the sign change, in an LO period succeeding the sign change associated with the input data, in order to process the input data during the sign change.

Example 22 is a differential RFDAC circuit, including the subject matter of example 21, wherein a number of half cell circuits in the first set of half cell circuits and a number of half cell circuits in the second set of half cell circuits is greater than a number of differential cells in the group of differential cells that are activated during regular operation.

Example 23 is a differential RFDAC circuit, including the subject matter of examples 21-22, including or omitting elements, wherein the number of half cell circuits in the first set of half cell circuits and the number of half cell circuits in the second set of half cell circuits is double that of the number of different cells in the group of differential cells that are activated during regular operation.

Example 24 is a differential RFDAC circuit, including the subject matter of examples 21-23, including or omitting elements, wherein the first half cell circuits and the second half cell circuits are activated during a first half of each LO period for positive input data, and wherein the first half cell circuits and the second half cell circuits are activated during a second half of each LO period for negative input data.

Example 25 is a differential RFDAC circuit, including the subject matter of examples 21-24, including or omitting elements, wherein the sign change associated with the input data comprises a negative to positive sign change.

Example 26 is a differential RFDAC circuit, including the subject matter of examples 21-25, including or omitting elements, wherein the first half cell circuits and the second half cell circuits are activated during a second half of each LO period for positive input data, and wherein the first half cell circuits and the second half cell circuits are activated during a first half of each LO period for negative input data.

Example 27 is a differential RFDAC circuit, including the subject matter of examples 21-26, including or omitting elements, wherein the sign change associated with the input data comprises a positive to negative sign change.

While the invention has been illustrated, and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A radio frequency digital-to-analog converter (RFDAC) circuit comprising:
    an RFDAC array circuit comprising an array of cells arranged into a plurality of segments, each segment comprising a set of cells, wherein each segment of the plurality of segments is configured to process input data signals; and wherein the RFDAC array circuit is configured to:
    process an input data based on activating a set of segments of the plurality of segments, forming a set of active segments, in accordance with a local oscillator (LO) signal; and
    when the sign of the input data is changed, deactivate a partially active segment of the set of active segments and activate a sign change segment within the RFDAC array circuit, in order to implement the sign change associated with the input data;
    wherein the sign change segment comprises a segment within the plurality of segments of the RFDAC array circuit that is different from the set of active segments.

2. The RFDAC circuit of claim 1, further comprising an LO circuit configured to:
    provide the LO signal to each segment of the set of active segments, to process input data during regular operation, and
    when the sign change of the input data occurs, deactivate the LO signal to the partially active segment and provide a sign change LO signal to the sign change segment to activate the sign change segment, in order to implement the sign change associated with the input data, wherein the sign change LO signal has inverted polarity relative to the LO signal or the sign change LO is shifted by substantially 180 degrees, with respect to the LO signal.

3. The RFDAC circuit of claim 2, further comprising an input decoder circuit configured to:
    provide a control data signal to the partially active segment, wherein the control data signal identifies a number of active cells within the partially active segment during regular operation; and
    when the sign change of the input data occurs, provide a sign change control data signal to the sign change segment, wherein the sign change control data signal reflects the control data signal to be provided to the partially active segment after the sign change, and wherein the sign change control data signal identifies a number of active cells within the sign change segment.

4. The RFDAC circuit of claim 1, wherein the sign change segment comprises any segment within the RFDAC array circuit that is different from the set of active segments.

5. The RFDAC circuit of claim 4, wherein the partially active segment comprises one or more partially active segments and the sign change segment comprises one or more sign change segments.

6. The RFDAC circuit of claim 1, wherein the sign change segment comprises one of a dedicated negative segment and a dedicated positive segment,
wherein the dedicated negative segment comprises a segment within the RFDAC array circuit configured to process only negative input data signals and wherein the dedicated negative segment comprises the sign change segment when the sign change associated with the input data comprises a positive to negative transition; and
wherein the dedicated positive segment comprises a segment within the RFDAC array circuit configured to process only positive input data signals and wherein the dedicated positive segment comprises the sign change segment when the sign change associated with the input data comprises a negative to positive transition.

7. The RFDAC circuit of claim 1, wherein the RFDAC array circuit is configured to deactivate the partially active segment of the set of active segments and activate the sign change segment within the RFDAC array circuit, during a predefined time interval following the sign change of the input data.

8. The RFDAC circuit of claim 7, wherein the RFDAC array circuit is further configured to deactivate the sign change segment, after the predefined time interval.

9. The RFDAC circuit of claim 7, wherein the predefined time interval comprises half an LO period after the sign change.

10. The RFDAC circuit of claim 1, when each cell of the RFDAC array circuit comprises a left half circuit and a right half circuit, wherein the left half cell circuit and the right half cell circuit are driven with opposite phases of the LO signal or with LO signal phase shifted by 180 degrees.

11. The RFDAC circuit of claim 10, wherein selectively deactivating the partially active segment comprises deactivating either the right half circuits or the left half circuits associated with the partially active segment that would experience a touching LO transition associated with the sign change, and activating the sign change segment comprises activating either the right half circuits or the left half circuits corresponding to the partially active segment.

12. The RFDAC circuit of claim 3, wherein the number of active cells within the partially active segment and the number of active cells within the sign change segment is different.

13. The RFDAC circuit of claim 3, wherein the input data comprises I-phase input data and Q-phase input data, and wherein the RFDAC array circuit, when processing the input data, is configured to:
process the I-phase input data based on activating a set of segments of the plurality of segments of the RFDAC array circuit, forming a set of I-phase segments, in accordance with the local oscillator (LO) signal; and
process the Q-phase input data based on activating a set of segments of the plurality of segments of the RFDAC array circuit, forming a set of Q-phase segments, in accordance with the local oscillator (LO) signal.

14. The RFDAC circuit of claim 13, wherein the RFDAC array circuit, when implementing the sign change, is configured to:
deactivate a partially active segment within the set of I-phase segments and activate a I-phase sign change segment within the RFDAC array circuit, in order to implement a sign change associated with the I-phase input data, wherein the I-phase sign change segment comprises a segment within the plurality of segments within the RFDAC array circuit that is different from the set of I-phase segments and the set of Q-phase segments; and
deactivate a partially active segment within the set of Q-phase segments and activate a Q-phase sign change segment within the RFDAC array circuit, in order to implement a sign change associated with the Q-phase input data, wherein the Q-phase sign change segment comprises a segment within the plurality of segments within the RFDAC array circuit that is different from the set of Q-phase segments and the set of I-phase segments.

15. The RFDAC circuit of claim 14, wherein the control data signal provided by the input decoder circuit comprises an I-phase control data signal that identifies a number of active cells within the partially active segment of the set of active I-phase segments, and a Q-phase control data signal that identifies a number of active cells within the partially active segment of the set of active Q-phase segments.

16. The RFDAC circuit of claim 15, wherein the sign change control data signal provided by the input decoder circuit comprises an I-phase sign change control data signal that identifies a number of active cells within the I-phase sign change segment, and a Q-phase sign change control data signal that identifies a number of active cells within the Q-phase sign change segment.

17. A radio frequency digital-to-analog converter (RF-DAC) circuit comprising:
an RFDAC array circuit comprising an array of cells arranged into a plurality of columns, each column comprising a set of cells, wherein each column of the plurality of columns is configured to process input data signals, and wherein the RFDAC array circuit is configured to:
process an input data based on activating one or more columns of the plurality of columns, in accordance with a predefined first filling order, when the sign of the input data is positive; and
process the input data based on activating one or more columns of the plurality of columns, in accordance with a predefined second, different, filling order, when the sign of the input data is negative;
wherein the filling order comprises a predefined order in which the plurality of columns is configured to be activated, in order to process the input data.

18. The RFDAC circuit of claim 17, wherein the predefined first filling order and the predefined second filling order differ by one or more columns.

19. The RFDAC circuit of claim 18, wherein the predefined first filling order and the predefined second filling order differ by one column, when the code variation associated with the sign change of the input data is less than one column.

20. The RFDAC circuit of claim 17, further comprising an input decoder circuit configured to:
- provide a first set of control signals to activate the one or more columns in accordance with the predefined first filling order, when the sign of the input data is positive; and
- provide a second, different, set of control signals to activate the one or more columns in accordance with the predefined second filling order, when the sign of the input data is negative.

21. A differential radio frequency digital-to-analog converter (RFDAC) circuit comprising:
- a differential RFDAC array circuit comprising an array of differential cells, each differential cell comprising a first half cell circuit and a second half cell circuit, wherein the first half cell circuit and the second half cell circuit are driven by a local oscillator (LO) signal and an inverse LO signal respectively, and wherein the differential RFDAC array circuit is configured to:
- process an input data based on activating the first half cell circuit and the second half cell circuit associated with a group of differential cells of the array of differential cells, simultaneously in each LO period, during regular operation;
- activate a first set of half cell circuits comprising either a set of first half cell circuits or a set of second half cell circuits in an LO period preceding a sign change associated with the input data, in order to process the input data during a sign change; and
- activate a second, different set of half cell circuits comprising either the set of first half cell circuits or the set of second half cell circuits that was not activated during the LO period preceding the sign change, in an LO period succeeding the sign change associated with the input data, in order to process the input data during the sign change.

22. The differential RFDAC circuit of claim 21, wherein a number of half cell circuits in the first set of half cell circuits and a number of half cell circuits in the second set of half cell circuits is greater than a number of differential cells in the group of differential cells that are activated during regular operation.

23. The differential RFDAC circuit of claim 22, wherein the number of half cell circuits in the first set of half cell circuits and the number of half cell circuits in the second set of half cell circuits is double that of the number of different cells in the group of differential cells that are activated during regular operation.

24. The differential RFDAC circuit of claim 21, wherein the first half cell circuits and the second half cell circuits are activated during a first half of each LO period for positive input data, and wherein the first half cell circuits and the second half cell circuits are activated during a second half of each LO period for negative input data.

25. The RFDAC circuit of claim 24, wherein the sign change associated with the input data comprises a negative to positive sign change.

26. The differential RFDAC circuit of claim 21, wherein the first half cell circuits and the second half cell circuits are activated during a second half of each LO period for positive input data, and wherein the first half cell circuits and the second half cell circuits are activated during a first half of each LO period for negative input data.

27. The RFDAC circuit of claim 26, wherein the sign change associated with the input data comprises a positive to negative sign change.

* * * * *